(12) United States Patent
Huang

(10) Patent No.: US 12,216,908 B2
(45) Date of Patent: Feb. 4, 2025

(54) MEMORY SYSTEMS, OPERATION METHODS THEREOF, AND ELECTRONIC DEVICES

(71) Applicant: Yangtze Memory Technologies Co., Ltd., Hubei (CN)

(72) Inventor: Zhen Huang, Hubei (CN)

(73) Assignee: YANGTZE MEMORY TECHNOLOGIES CO., LTD., Hubei (CN)

( * ) Notice: Subject to any disclaimer, the term of this patent is extended or adjusted under 35 U.S.C. 154(b) by 215 days.

(21) Appl. No.: 18/148,961

(22) Filed: Dec. 30, 2022

(65) Prior Publication Data

US 2024/0168643 A1    May 23, 2024

(30) Foreign Application Priority Data

Nov. 18, 2022  (CN) .......................... 202211447947.8

(51) Int. Cl.
    *G06F 3/06* (2006.01)
(52) U.S. Cl.
    CPC .......... *G06F 3/0613* (2013.01); *G06F 3/0659* (2013.01); *G06F 3/0673* (2013.01)
(58) Field of Classification Search
    CPC .... G06F 3/0613; G06F 3/0659; G06F 3/0673; G06F 3/061; G06F 3/0652; G06F 3/0679; G06F 13/1668; G11C 29/028; G11C 29/42; G11C 29/52; G11C 29/021; G11C 16/0483; G11C 16/10; G11C 16/26
    USPC ..................................... 365/185.09
    See application file for complete search history.

(56) References Cited

U.S. PATENT DOCUMENTS

2021/0223974 A1*  7/2021  Zhang ..................... G06F 3/061
2021/0294524 A1*  9/2021  Lin ........................ G06F 3/0659

* cited by examiner

*Primary Examiner* — Huan Hoang
(74) *Attorney, Agent, or Firm* — Hanley, Flight & Zimmerman, LLC

(57) ABSTRACT

In one example, the memory system includes a memory coupled to a memory controller; the memory includes a plurality of word lines and a plurality of multi-bit memory cells coupled to the plurality of word lines; the memory includes multiple types of pages, each corresponding to a one read voltage level. In one example, the operation method includes obtaining, when a read operation of the memory fails, a target read retry table from a set of read retry tables, the set of read retry tables comprises all read retry tables corresponding to the multiple types of pages; a read retry table corresponding to each type of page comprises a set of bias voltages corresponding to respective read voltage levels that are used to distinguish stored data of corresponding bit; obtaining read retry voltages through the target read retry table, and performing a read retry operation using the read retry voltages.

20 Claims, 16 Drawing Sheets

100

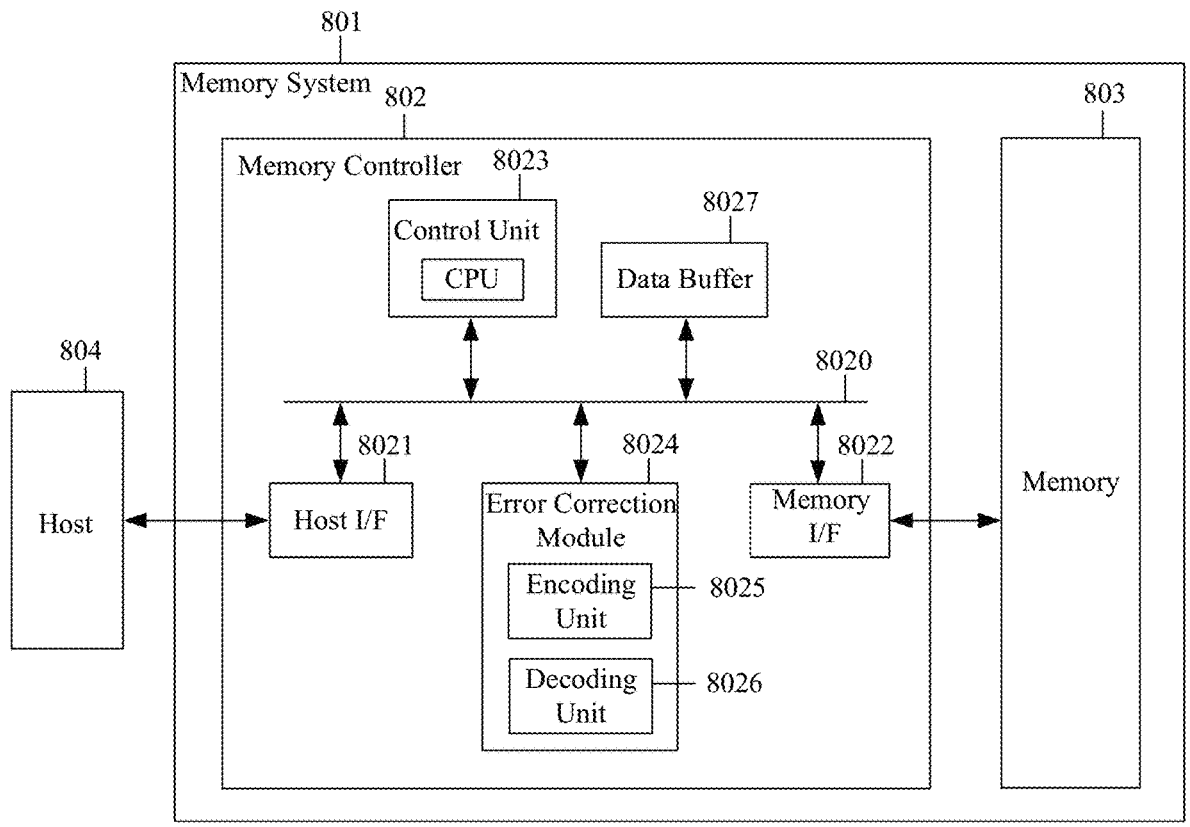

Fig. 8

Obtaining, when a read operation of the memory fails, a target read retry table from a set of read retry tables; wherein, each type of page in the multiple types of pages corresponds to a plurality of read retry tables; the set of read retry tables includes all read retry tables corresponding to the multiple types of pages; a read retry table corresponding to each type of page includes a set of bias voltages corresponding to respective read voltage levels that are used to distinguish stored data of corresponding bit — 901

Obtaining read retry voltages through the target read retry table, and performing a read retry operation using the read retry voltages — 902

Fig. 9

| Read Retry Option | Rd1 LP | | Rd2 MP | | Rd3 UP | | Rd4 MP | | Rd5 LP | | Rd6 MP | | Rd7 UP | | Option |
|---|---|---|---|---|---|---|---|---|---|---|---|---|---|---|---|
| | Bias Voltage | Shifted Position | Bias Voltage | Shifted Position | Bias Voltage | Shifted Position | Bias Voltage | Shifted Position | Bias Voltage | Shifted Position | Bias Voltage | Shifted Position | Bias Voltage | Shifted Position | |
| Word Line | a1 | b1 | c1 | d1 | e1 | f1 | g1 | h1 | i1 | j1 | k1 | l1 | m1 | n1 | RR-1 |
| | a2 | b2 | c2 | d2 | e2 | f2 | g2 | h2 | i2 | j2 | k2 | l2 | m2 | n2 | RR-2 |
| | a3 | b3 | c3 | d3 | e3 | f3 | g3 | h3 | i3 | j3 | k3 | l3 | m3 | n3 | RR-3 |
| | a4 | b4 | c4 | d4 | e4 | f4 | g4 | h4 | i4 | j4 | k4 | l4 | m4 | n4 | RR-4 |
| | a5 | b5 | c5 | d5 | e5 | f5 | g5 | h5 | i5 | j5 | k5 | l5 | m5 | n5 | RR-5 |
| | a6 | b6 | c6 | d6 | e6 | f6 | g6 | h6 | i6 | j6 | k6 | l6 | m6 | n6 | RR-6 |
| | a7 | b7 | c7 | d7 | e7 | f7 | g7 | h7 | i7 | j7 | k7 | l7 | m7 | n7 | RR-7 |
| | a8 | b8 | c8 | d8 | e8 | f8 | g8 | h8 | i8 | j8 | k8 | l8 | m8 | n8 | RR-8 |
| | a9 | b9 | c9 | d9 | e9 | f9 | g9 | h9 | i9 | j9 | k9 | l9 | m9 | n9 | RR-9 |
| | a10 | b10 | c10 | d10 | e10 | f10 | g10 | h10 | i10 | j10 | k10 | l10 | m10 | n10 | RR-10 |
| | a11 | b11 | c11 | d11 | e11 | f11 | g11 | h11 | i11 | j11 | k11 | l11 | m11 | n11 | RR-11 |
| | a12 | b12 | c12 | d12 | e12 | f12 | g12 | h12 | i12 | j12 | k12 | l12 | m12 | n12 | RR-12 |
| | a13 | b13 | c13 | d13 | e13 | f13 | g13 | h13 | i13 | j13 | k13 | l13 | m13 | n13 | RR-13 |
| | a14 | b14 | c14 | d14 | e14 | f14 | g14 | h14 | i14 | j14 | k14 | l14 | m14 | n14 | RR-14 |
| | a15 | b15 | c15 | d15 | e15 | f15 | g15 | h15 | i15 | j15 | k15 | l15 | m15 | n15 | RR-15 |
| | a16 | b16 | c16 | d16 | e16 | f16 | g16 | h16 | i16 | j16 | k16 | l16 | m16 | n16 | RR-16 |
| | a17 | b17 | c17 | d17 | e17 | f17 | g17 | h17 | i17 | j17 | k17 | l17 | m17 | n17 | RR-17 |
| | a18 | b18 | c18 | d18 | e18 | f18 | g18 | h18 | i18 | j18 | k18 | l18 | m18 | n18 | RR-18 |
| | a19 | b19 | c19 | d19 | e19 | f19 | g19 | h19 | i19 | j19 | k19 | l19 | m19 | n19 | RR-19 |
| | a20 | b20 | c20 | d20 | e20 | f20 | g20 | h20 | i20 | j20 | k20 | l20 | m20 | n20 | RR-20 |
| | a21 | b21 | c21 | d21 | e21 | f21 | g21 | h21 | i21 | j21 | k21 | l21 | m21 | n21 | RR-21 |
| | a22 | b22 | c22 | d22 | e22 | f22 | g22 | h22 | i22 | j22 | k22 | l22 | m22 | n22 | RR-22 |
| | a23 | b23 | c23 | d23 | e23 | f23 | g23 | h23 | i23 | j23 | k23 | l23 | m23 | n23 | RR-23 |
| | a24 | b24 | c24 | d24 | e24 | f24 | g24 | h24 | i24 | j24 | k24 | l24 | m24 | n24 | RR-24 |
| | a25 | b25 | c25 | d25 | e25 | f25 | g25 | h25 | i25 | j25 | k25 | l25 | m25 | n25 | RR-25 |
| | a26 | b26 | c26 | d26 | e26 | f26 | g26 | h26 | i26 | j26 | k26 | l26 | m26 | n26 | RR-26 |
| | a27 | b27 | c27 | d27 | e27 | f27 | g27 | h27 | i27 | j27 | k27 | l27 | m27 | n27 | RR-27 |
| | a28 | b28 | c28 | d28 | e28 | f28 | g28 | h28 | i28 | j28 | k28 | l28 | m28 | n28 | RR-28 |
| | a29 | b29 | c29 | d29 | e29 | f29 | g29 | h29 | i29 | j29 | k29 | l29 | m29 | n29 | RR-29 |

Fig. 10a

| Read Retry Option | Rd1 LP | | Rd5 LP | | Option |
|---|---|---|---|---|---|
| | Bias Voltage | Shifted Position | Bias Voltage | Shifted Position | |
| Word Line | a1 | b1 | i1 | j1 | RR-1 |
| | a2 | b2 | i2 | j2 | RR-2 |
| | a3 | b3 | i3 | j3 | RR-3 |
| | a4 | b4 | i4 | j4 | RR-4 |
| | a5 | b5 | i5 | j5 | RR-5 |
| | a6 | b6 | i6 | j6 | RR-6 |
| | a7 | b7 | i7 | j7 | RR-7 |
| | a8 | b8 | i8 | j8 | RR-8 |
| | a9 | b9 | i9 | j9 | RR-9 |
| | a10 | b10 | i10 | j10 | RR-10 |
| | a11 | b11 | i11 | j11 | RR-11 |
| | a12 | b12 | i12 | j12 | RR-12 |
| | a13 | b13 | i13 | j13 | RR-13 |
| | a14 | b14 | i14 | j14 | RR-14 |
| | a15 | b15 | i15 | j15 | RR-15 |
| | a16 | b16 | i16 | j16 | RR-16 |
| | a17 | b17 | i17 | j17 | RR-17 |
| | a18 | b18 | i18 | j18 | RR-18 |
| | a19 | b19 | i19 | j19 | RR-19 |
| | a20 | b20 | i20 | j20 | RR-20 |
| | a21 | b21 | i21 | j21 | RR-21 |
| | a22 | b22 | i22 | j22 | RR-22 |
| | a23 | b23 | i23 | j23 | RR-23 |
| | a24 | b24 | i24 | j24 | RR-24 |
| | a25 | b25 | i25 | j25 | RR-25 |
| | a26 | b26 | i26 | j26 | RR-26 |
| | a27 | b27 | i27 | j27 | RR-27 |
| | a28 | b28 | i28 | j28 | RR-28 |
| | a29 | b29 | i29 | j29 | RR-29 |

Fig. 10b

| Read Retry Option | Rd2 MP | | Rd4 MP | | Rd6 MP | | Option |
|---|---|---|---|---|---|---|---|
| | Bias Voltage | Shifted Position | Bias Voltage | Shifted Position | Bias Voltage | Shifted Position | |
| Word Line | c1 | d1 | g1 | h1 | k1 | l1 | RR-1 |
| | c2 | d2 | g2 | h2 | k2 | l2 | RR-2 |
| | c3 | d3 | g3 | h3 | k3 | l3 | RR-3 |
| | c4 | d4 | g4 | h4 | k4 | l4 | RR-4 |
| | c5 | d5 | g5 | h5 | k5 | l5 | RR-5 |
| | c6 | d6 | g6 | h6 | k6 | l6 | RR-6 |
| | c7 | d7 | g7 | h7 | k7 | l7 | RR-7 |
| | c8 | d8 | g8 | h8 | k8 | l8 | RR-8 |
| | c9 | d9 | g9 | h9 | k9 | l9 | RR-9 |
| | c10 | d10 | g10 | h10 | k10 | l10 | RR-10 |
| | c11 | d11 | g11 | h11 | k11 | l11 | RR-11 |
| | c12 | d12 | g12 | h12 | k12 | l12 | RR-12 |
| | c13 | d13 | g13 | h13 | k13 | l13 | RR-13 |
| | c14 | d14 | g14 | h14 | k14 | l14 | RR-14 |
| | c15 | d15 | g15 | h15 | k15 | l15 | RR-15 |
| | c16 | d16 | g16 | h16 | k16 | l16 | RR-16 |
| | c17 | d17 | g17 | h17 | k17 | l17 | RR-17 |
| | c18 | d18 | g18 | h18 | k18 | l18 | RR-18 |
| | c19 | d19 | g19 | h19 | k19 | l19 | RR-19 |
| | c20 | d20 | g20 | h20 | k20 | l20 | RR-20 |
| | c21 | d21 | g21 | h21 | k21 | l21 | RR-21 |
| | c22 | d22 | g22 | h22 | k22 | l22 | RR-22 |
| | c23 | d23 | g23 | h23 | k23 | l23 | RR-23 |
| | c24 | d24 | g24 | h24 | k24 | l24 | RR-24 |
| | c25 | d25 | g25 | h25 | k25 | l25 | RR-25 |
| | c26 | d26 | g26 | h26 | k26 | l26 | RR-26 |
| | c27 | d27 | g27 | h27 | k27 | l27 | RR-27 |
| | c28 | d28 | g28 | h28 | k28 | l28 | RR-28 |
| | c29 | d29 | g29 | h29 | k29 | l29 | RR-29 |

Fig. 10c

| Read Retry Option | Rd3 UP | | Rd7 UP | | Option |
|---|---|---|---|---|---|
| | Bias Voltage | Shifted Position | Bias Voltage | Shifted Position | |
| Word Line | e1 | f1 | m1 | n1 | RR-1 |
| | e2 | f2 | m2 | n2 | RR-2 |
| | e3 | f3 | m3 | n3 | RR-3 |
| | e4 | f4 | m4 | n4 | RR-4 |
| | e5 | f5 | m5 | n5 | RR-5 |
| | e6 | f6 | m6 | n6 | RR-6 |
| | e7 | f7 | m7 | n7 | RR-7 |
| | e8 | f8 | m8 | n8 | RR-8 |
| | e9 | f9 | m9 | n9 | RR-9 |
| | e10 | f10 | m10 | n10 | RR-10 |
| | e11 | f11 | m11 | n11 | RR-11 |
| | e12 | f12 | m12 | n12 | RR-12 |
| | e13 | f13 | m13 | n13 | RR-13 |
| | e14 | f14 | m14 | n14 | RR-14 |
| | e15 | f15 | m15 | n15 | RR-15 |
| | e16 | f16 | m16 | n16 | RR-16 |
| | e17 | f17 | m17 | n17 | RR-17 |
| | e18 | f18 | m18 | n18 | RR-18 |
| | e19 | f19 | m19 | n19 | RR-19 |
| | e20 | f20 | m20 | n20 | RR-20 |
| | e21 | f21 | m21 | n21 | RR-21 |
| | e22 | f22 | m22 | n22 | RR-22 |
| | e23 | f23 | m23 | n23 | RR-23 |
| | e24 | f24 | m24 | n24 | RR-24 |
| | e25 | f25 | m25 | n25 | RR-25 |
| | e26 | f26 | m26 | n26 | RR-26 |
| | e27 | f27 | m27 | n27 | RR-27 |
| | e28 | f28 | m28 | n28 | RR-28 |
| | e29 | f29 | m29 | n29 | RR-29 |

Fig. 10d

| Read Retry Option | Rd1 LP | | Rd2 MP | | Rd3 UP | | Rd4 MP | | Rd5 LP | | Rd6 MP | | Rd7 UP | | Option |
|---|---|---|---|---|---|---|---|---|---|---|---|---|---|---|---|
| | Bias Voltage | Shifted Position | Bias Voltage | Shifted Position | Bias Voltage | Shifted Position | Bias Voltage | Shifted Position | Bias Voltage | Shifted Position | Bias Voltage | Shifted Position | Bias Voltage | Shifted Position | |
| Word Line | a1 | b1 | c1 | d1 | e1 | f1 | g1 | h1 | i1 | j1 | k1 | l1 | m1 | n1 | RR-1 |
| | a2 | b2 | c2 | d2 | e2 | f2 | g2 | h2 | i2 | j2 | k2 | l2 | m2 | n2 | RR-2 |
| | a3 | b3 | c3 | d3 | e3 | f3 | g3 | h3 | i3 | j3 | k3 | l3 | m3 | n3 | RR-3 |
| | a4 | b4 | c4 | d4 | e4 | f4 | g4 | h4 | i4 | j4 | k4 | l4 | m4 | n4 | RR-4 |
| | a5 | b5 | c5 | d5 | e5 | f5 | g5 | h5 | i5 | j5 | k5 | l5 | m5 | n5 | RR-5 |
| | a6 | b6 | c6 | d6 | e6 | f6 | g6 | h6 | i6 | j6 | k6 | l6 | m6 | n6 | RR-6 |
| | a7 | b7 | c7 | d7 | e7 | f7 | g7 | h7 | i7 | j7 | k7 | l7 | m7 | n7 | RR-7 |
| | a8 | b8 | c8 | d8 | e8 | f8 | g8 | h8 | i8 | j8 | k8 | l8 | m8 | n8 | RR-8 |
| | a9 | b9 | c9 | d9 | e9 | f9 | g9 | h9 | i9 | j9 | k9 | l9 | m9 | n9 | RR-9 |
| | a10 | b10 | c10 | d10 | e10 | f10 | g10 | h10 | i10 | j10 | k10 | l10 | m10 | n10 | RR-10 |
| | a11 | b11 | c11 | d11 | e11 | f11 | g11 | h11 | i11 | j11 | k11 | l11 | m11 | n11 | RR-11 |
| | a12 | b12 | c12 | d12 | e12 | f12 | g12 | h12 | i12 | j12 | k12 | l12 | m12 | n12 | RR-12 |
| | a13 | b13 | c13 | d13 | e13 | f13 | g13 | h13 | i13 | j13 | k13 | l13 | m13 | n13 | RR-13 |
| | a14 | b14 | c14 | d14 | e14 | f14 | g14 | h14 | i14 | j14 | k14 | l14 | m14 | n14 | RR-14 |
| | a15 | b15 | c15 | d15 | e15 | f15 | g15 | h15 | i15 | j15 | k15 | l15 | m15 | n15 | RR-15 |
| | a16 | b16 | c16 | d16 | e16 | f16 | g16 | h16 | i16 | j16 | k16 | l16 | m16 | n16 | RR-16 |
| | a17 | b17 | c17 | d17 | e17 | f17 | g17 | h17 | i17 | j17 | k17 | l17 | m17 | n17 | RR-17 |
| | a18 | b18 | c18 | d18 | e18 | f18 | g18 | h18 | i18 | j18 | k18 | l18 | m18 | n18 | RR-18 |
| | a19 | b19 | c19 | d19 | e19 | f19 | g19 | h19 | i19 | j19 | k19 | l19 | m19 | n19 | RR-19 |
| | a20 | b20 | c20 | d20 | e20 | f20 | g20 | h20 | i20 | j20 | k20 | l20 | m20 | n20 | RR-20 |
| | a21 | b21 | c21 | d21 | e21 | f21 | g21 | h21 | i21 | j21 | k21 | l21 | m21 | n21 | RR-21 |
| | a22 | b22 | c22 | d22 | e22 | f22 | g22 | h22 | i22 | j22 | k22 | l22 | m22 | n22 | RR-22 |
| | a23 | b23 | c23 | d23 | e23 | f23 | g23 | h23 | i23 | j23 | k23 | l23 | m23 | n23 | RR-23 |
| | a24 | b24 | c24 | d24 | e24 | f24 | g24 | h24 | i24 | j24 | k24 | l24 | m24 | n24 | RR-24 |
| | a25 | b25 | c25 | d25 | e25 | f25 | g25 | h25 | i25 | j25 | k25 | l25 | m25 | n25 | RR-25 |
| | a26 | b26 | c26 | d26 | e26 | f26 | g26 | h26 | i26 | j26 | k26 | l26 | m26 | n26 | RR-26 |
| | a27 | b27 | c27 | d27 | e27 | f27 | g27 | h27 | i27 | j27 | k27 | l27 | m27 | n27 | RR-27 |
| | a28 | b28 | c28 | d28 | e28 | f28 | g28 | h28 | i28 | j28 | k28 | l28 | m28 | n28 | RR-28 |

Fig. 11a

| Read Retry Option | Rd1 LP | | Rd5 LP | | Option |
|---|---|---|---|---|---|
| | Bias Voltage | Shifted Position | Bias Voltage | Shifted Position | |
| Word Line | a1 | b1 | i1 | j1 | RR-1 |
| | a2 | b2 | i2 | j2 | RR-2 |
| | a3 | b3 | i3 | j3 | RR-3 |
| | a4 | b4 | i4 | j4 | RR-4 |
| | a5 | b5 | i5 | j5 | RR-5 |
| | a6 | b6 | i6 | j6 | RR-6 |
| | a7 | b7 | i7 | j7 | RR-7 |
| | a8 | b8 | i8 | j8 | RR-8 |
| | a9 | b9 | i9 | j9 | RR-9 |
| | a10 | b10 | i10 | j10 | RR-10 |
| | a11 | b11 | i11 | j11 | RR-11 |
| | a12 | b12 | i12 | j12 | RR-12 |
| | a13 | b13 | i13 | j13 | RR-13 |
| | a14 | b14 | i14 | j14 | RR-14 |
| | a15 | b15 | i15 | j15 | RR-15 |
| | a16 | b16 | i16 | j16 | RR-16 |
| | a17 | b17 | i17 | j17 | RR-17 |
| | a18 | b18 | i18 | j18 | RR-18 |
| | a19 | b19 | i19 | j19 | RR-19 |
| | a20 | b20 | i20 | j20 | RR-20 |
| | a21 | b21 | i21 | j21 | RR-21 |
| | a22 | b22 | i22 | j22 | RR-22 |
| | a23 | b23 | i23 | j23 | RR-23 |
| | a24 | b24 | i24 | j24 | RR-24 |
| | a25 | b25 | i25 | j25 | RR-25 |
| | a26 | b26 | i26 | j26 | RR-26 |
| | a27 | b27 | i27 | j27 | RR-27 |
| | a28 | b28 | i28 | j28 | RR-28 |

Fig. 11b

| Read Retry Option | Rd2 MP | | Rd4 MP | | Rd6 MP | | Option |
|---|---|---|---|---|---|---|---|
| | Bias Voltage | Shifted Position | Bias Voltage | Shifted Position | Bias Voltage | Shifted Position | |
| Word Line | c1 | d1 | g1 | h1 | k1 | l1 | RR-1 |
| | c2 | d2 | g2 | h2 | k2 | l2 | RR-2 |
| | c3 | d3 | g3 | h3 | k3 | l3 | RR-3 |
| | c4 | d4 | g4 | h4 | k4 | l4 | RR-4 |
| | c5 | d5 | g5 | h5 | k5 | l5 | RR-5 |
| | c6 | d6 | g6 | h6 | k6 | l6 | RR-6 |
| | c7 | d7 | g7 | h7 | k7 | l7 | RR-7 |
| | c8 | d8 | g8 | h8 | k8 | l8 | RR-8 |
| | c9 | d9 | g9 | h9 | k9 | l9 | RR-9 |
| | c10 | d10 | g10 | h10 | k10 | l10 | RR-10 |
| | c11 | d11 | g11 | h11 | k11 | l11 | RR-11 |
| | c12 | d12 | g12 | h12 | k12 | l12 | RR-12 |
| | c13 | d13 | g13 | h13 | k13 | l13 | RR-13 |
| | c14 | d14 | g14 | h14 | k14 | l14 | RR-14 |
| | c15 | d15 | g15 | h15 | k15 | l15 | RR-15 |
| | c16 | d16 | g16 | h16 | k16 | l16 | RR-16 |
| | c17 | d17 | g17 | h17 | k17 | l17 | RR-17 |
| | c18 | d18 | g18 | h18 | k18 | l18 | RR-18 |
| | c19 | d19 | g19 | h19 | k19 | l19 | RR-19 |
| | c20 | d20 | g20 | h20 | k20 | l20 | RR-20 |
| | c21 | d21 | g21 | h21 | k21 | l21 | RR-21 |
| | c22 | d22 | g22 | h22 | k22 | l22 | RR-22 |
| | c23 | d23 | g23 | h23 | k23 | l23 | RR-23 |
| | c24 | d24 | g24 | h24 | k24 | l24 | RR-24 |
| | c25 | d25 | g25 | h25 | k25 | l25 | RR-25 |
| | c26 | d26 | g26 | h26 | k26 | l26 | RR-26 |
| | c27 | d27 | g27 | h27 | k27 | l27 | RR-27 |
| | c28 | d28 | g28 | h28 | k28 | l28 | RR-28 |

Fig. 11c

| Read Retry Option | Rd3 UP | | Rd7 UP | | Option |
|---|---|---|---|---|---|
| | Bias Voltage | Shifted Position | Bias Voltage | Shifted Position | |
| Word Line | e1 | f1 | m1 | n1 | RR-1 |
| | e2 | f2 | m2 | n2 | RR-2 |
| | e3 | f3 | m3 | n3 | RR-3 |
| | e4 | f4 | m4 | n4 | RR-4 |
| | e5 | f5 | m5 | n5 | RR-5 |
| | e6 | f6 | m6 | n6 | RR-6 |
| | e7 | f7 | m7 | n7 | RR-7 |
| | e8 | f8 | m8 | n8 | RR-8 |
| | e9 | f9 | m9 | n9 | RR-9 |
| | e10 | f10 | m10 | n10 | RR-10 |
| | e11 | f11 | m11 | n11 | RR-11 |
| | e12 | f12 | m12 | n12 | RR-12 |
| | e13 | f13 | m13 | n13 | RR-13 |
| | e14 | f14 | m14 | n14 | RR-14 |
| | e15 | f15 | m15 | n15 | RR-15 |
| | e16 | f16 | m16 | n16 | RR-16 |
| | e17 | f17 | m17 | n17 | RR-17 |
| | e18 | f18 | m18 | n18 | RR-18 |
| | e19 | f19 | m19 | n19 | RR-19 |
| | e20 | f20 | m20 | n20 | RR-20 |
| | e21 | f21 | m21 | n21 | RR-21 |
| | e22 | f22 | m22 | n22 | RR-22 |
| | e23 | f23 | m23 | n23 | RR-23 |
| | e24 | f24 | m24 | n24 | RR-24 |
| | e25 | f25 | m25 | n25 | RR-25 |
| | e26 | f26 | m26 | n26 | RR-26 |
| | e27 | f27 | m27 | n27 | RR-27 |
| | e28 | f28 | m28 | n28 | RR-28 |

Fig. 11d

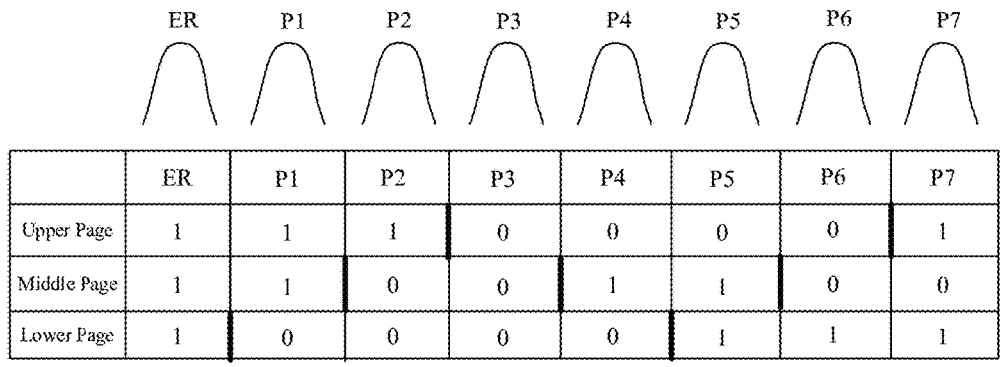

| | ER | P1 | P2 | P3 | P4 | P5 | P6 | P7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

Fig. 12

| Initial Read Retry Table | LRU Operation Phase | | | | LRU Result |
|---|---|---|---|---|---|
| | #1 | #2 | #3 | #4 | #5 |
| Table1 | Table52 | Table7 | Table54 | Table5 | Table52 |
| Table2 | Table1 | Table52 | Table7 | Table54 | Table5 |
| Table3 | Table2 | Table1 | Table52 | Table7 | Table54 |
| Table4 | Table3 | Table2 | Table1 | Table52 | Table7 |
| Table5 | Table4 | Table3 | Table2 | Table1 | Table1 |
| Table6 | Table5 | Table4 | Table3 | Table2 | Table2 |
| Table7 | Table6 | Table5 | Table4 | Table3 | Table3 |
| Table8 | Table7 | Table6 | Table5 | Table4 | Table4 |
| Table9 | Table8 | Table8 | Table6 | Table6 | Table6 |
| : | Table9 | Table9 | Table8 | Table8 | Table8 |
| Table50 | : | : | Table9 | Table9 | Table9 |
| Table51 | Table50 | Table50 | : | : | : |
| Table52 | Table51 | Table51 | Table50 | Table50 | Table50 |
| Table53 | Table53 | Table53 | Table51 | Table51 | Table51 |
| Table54 | Table54 | Table54 | Table53 | Table53 | Table53 |
| Table55 | Table55 | Table55 | Table55 | Table55 | Table55 |

Fig. 13

MEMORY SYSTEMS, OPERATION METHODS THEREOF, AND ELECTRONIC DEVICES

RELATED APPLICATIONS

This application claims priority to and the benefit of Chinese Patent Application No. 202211447947.8, filed on Nov. 18, 2022, which is hereby incorporated by reference in its entirety.

TECHNICAL FIELD

The present disclosure relates to semiconductors, and, in particular, to memory systems, operation methods thereof, and electronic devices.

BACKGROUND

Memory is a storage device used to store information in modern information technology. As a typical nonvolatile semiconductor memory, NAND (Not-And) memory has become the mainstream product in the storage market because of its high storage density, controllable production cost, suitable program and erase speed as well as retention characteristics.

However, with the increasing demand for memory, there are still many problems for memory and its system when performing read and write operations.

BRIEF DESCRIPTION OF THE DRAWINGS

FIG. 8 is a block diagram of a memory system according to an example of the present disclosure;

FIG. 9 is a schematic flow diagram of the implementation of an operation method of a memory system according to an example of the present disclosure;

FIG. 10a is a schematic diagram of a first set of read retry tables provided by an example of the present disclosure;

FIGS. 10b-10d are each a set of read retry tables provided by an example of the present disclosure;

FIG. 11a is a schematic diagram of a second set of read retry tables provided by an example of the present disclosure;

FIGS. 11b-11d are each another set of read retry tables provided by an example of the present disclosure;

FIG. 12 is a schematic diagram of a Gray Code encoding rule provided by an example of the present disclosure;

FIG. 13 is a schematic diagram of a least recently used LRU algorithm provided by an example of the present disclosure.

DETAILED DESCRIPTION

Figure 1:
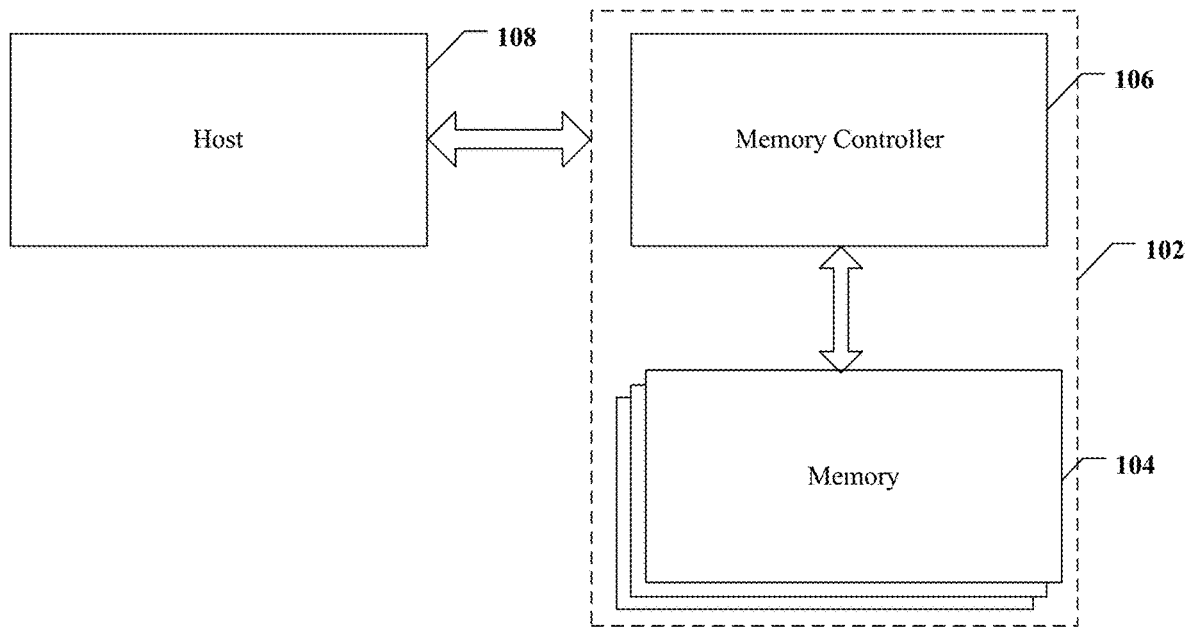
FIG. 1 is a schematic diagram of an example system having a memory system according to an example of the present disclosure.

Example of the present disclosure will be described in more detail below with reference to the accompanying drawings. Although examples of the present disclosure are shown in the drawings, it should be understood that the present disclosure may be implemented in various forms and should not be limited to the specific examples set forth herein. Rather, these examples are provided so that the present disclosure can be understood more thoroughly and the scope of the present disclosure can be fully conveyed to those skilled in the art.

In the following description, numerous specific details are given in order to provide a more thorough understanding of the present disclosure. It will be apparent, however, to one skilled in the art that the present disclosure may be practiced without one or more of these details. In other instances, in order to avoid confusion with the present disclosure, some technical features known in the art are not described. That is, herein, not all features of a specific example are described and well-known functions and structures are not described in detail.

It should be understood that when an element or layer is referred to as being "on," "adjacent to," "connected to" or "coupled to" another element or layer, it can be directly on, adjacent to, connected to, or coupled to the other element or layer, or there may exist intervening elements or layers. In contrast, when an element is referred to as being "directly on," "directly adjacent to," "directly connected to" or "directly coupled to" another element or layer, there are no intervening elements or layers therebetween. It should be understood that, although the terms first, second, third etc. may be used to describe various elements, components, regions, layers and/or sections, these elements, components, regions, layers and/or sections should not be limited by these terms. These terms are merely used to distinguish one element, component, region, layer or section from another. Thus, a first element, component, region, layer or section discussed below could be termed a second element, component, region, layer or section, without departing from the teachings of the present disclosure. Whereas a second element, component, region, layer or section is discussed, it does not indicate that a first element, component, region, layer or section exists in the present disclosure necessarily.

Spatial relation terms, such as "beneath", "below", "lower", "under", "above", "on" etc., may be used herein for convenience of description, to describe the relationship of one element or feature to other elements or features shown in the drawing. It should be understood that the spatial relation terms are intended to include different orientations of devices in use and in operation, in addition to the orientations shown in the figure. For example, if the devices in the drawings are flipped, the element or feature described as "below" or "under" or "beneath" the other element or feature will be oriented as being "above" the other element or feature. Thus, the example terms "below" and "under" may include both upper and lower orientations. The devices may be additionally oriented (rotated 90 degrees or other orientations) and the spatial descriptors used herein are explained accordingly.

The terminology used herein is for the purpose of describing specific examples only and is not a limitation of the present disclosure. As used herein, the singular forms of "a", "an" and "the" are also intended to include the plural forms unless the context clearly indicates otherwise. It should also be understood that the terms "composed of" and/or "comprise" when used in this specification determine the presence of the feature, integer, step, operation, element and/or component, but do not exclude the presence or addition of one or more other features, integers, steps, operations, elements, components and/or groups. As used herein, the term "and/or" includes any and all combinations of related listed items.

In order to enable a more detailed understanding of the features and technical content of examples of the present disclosure, the implementations of the examples of the present disclosure are described in detail below in conjunction with the accompanying drawings, which are attached for illustration only and are not intended to limit the examples of the present disclosure.

Memory in the examples of the present disclosure includes, but is not limited to, a three-dimensional NAND type memory which is illustrated by way of example for ease of understanding.

FIG. 1 shows a block diagram of an example system 100 with memory in accordance with aspects of the present disclosure. System 100 may be a mobile phone, desktop computer, laptop computer, tablet computer, vehicle computer, game console, printer, pointing device, wearable electronic device, smart sensor, virtual reality (VR) device, augmented reality (AR) device or any other suitable electronic device having memory therein. As shown in FIG. 1, system 100 may include a host 108 and a memory system 102 having one or more memories 104 and a memory controller 106. The host 108 may be a processor (e.g., a central processing unit (CPU)) or a system on a chip (SoC) (e.g., an application processor (AP)) of an electronic device. The host 108 may be configured to send data to or receive data from memory 104.

According to some implementations, the memory controller 106 is coupled to the memory 104 and the host 108 and is configured to control the memory 104. The memory controller 106 may manage data stored in the memory 104 and communicate with the host 108. In some implementations, the memory controller 106 is designed to operate in a low duty cycle environment such as Secure Digital (SD) card, Compact Flash (CF) card, Universal Serial Bus (USB) flash drive, or other media for use in electronic devices such as personal computers, digital cameras, mobile phones, and the like. In some implementations, the memory controller 106 is designed for operation in a high duty cycle environment SSD or embedded multimedia card (eMMC) where SSD or eMMC is used as data memory of a mobile device (such as a smartphone, tablet computer, laptop computer, etc.), as well as enterprise storage array.

The memory controller 106 may be configured to control operations of the memory 104, such as read, erase and program operations. The memory controller 106 may also be configured to manage various functions related to data stored or to be stored in the memory 104, including but not limited to bad block management, garbage collection, logical-to-physical address translation, wear leveling, and the like. In some implementations, the memory controller 106 is also configured to process error correction code (ECC) on data read from or written to the memory 104. The memory controller 106 may also perform any other suitable functions, such as formatting the memory 104. The memory controller 106 may communicate with external devices (e.g., host 108) according to a particular communication protocol. For example, the memory controller 106 can communicate with external devices through at least one of various interface protocols, such as USB protocol, MMC protocol, Peripheral Component Interconnect (PCI) protocol, PCI Express (PCI-E) protocol, Advanced Technology Attachment (ATA) protocol, Serial ATA protocol, Parallel ATA protocol, Small Computer Small Interface (SCSI) protocol, Enhanced Small Disk Interface (ESDI) protocol, Integrated Drive Electronics (IDE) protocol, Firewire protocol, etc.

Figure 2A:
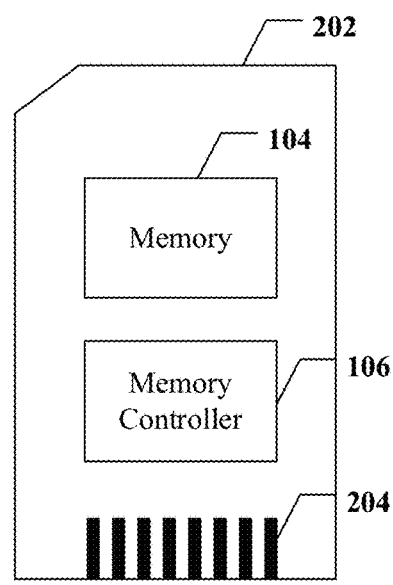
FIG. 2a is a schematic diagram of an example memory card having a memory system according to an example of the present disclosure.
Figure 2B:
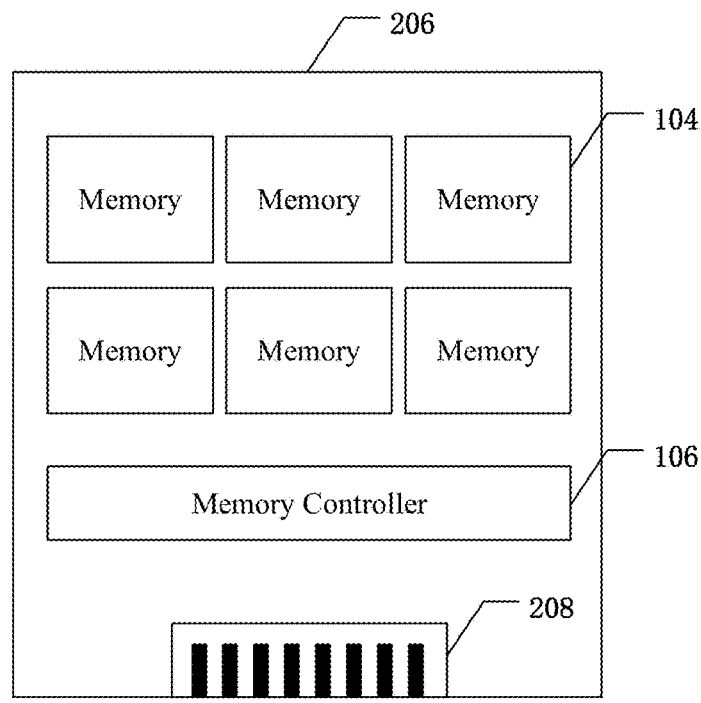
FIG. 2b is a schematic diagram of an example solid-state drive having a memory system according to an example of the present disclosure.

The memory controller 106 and one or more memories 104 may be integrated into various types of memory devices, for example included in the same package (e.g. Universal Flash Storage (UFS) package or eMMC package). That is, the memory system 102 may be implemented and packaged into different types of terminal electronics. In an example as shown in FIG. 2a, the memory controller 106 and a single memory 104 may be integrated into a memory card 202. The memory card 202 may include a PC card (PCMCIA, Personal Computer Memory Card International Association), a CF card, a Smart Media (SM) card, a memory stick, a multimedia card (MMC, RS-MMC, MMCmicro), an SD card (SD, miniSD, microSD, SDHC), a UFS, and the like. The memory card 202 may also include a memory card connector 204 that couples the memory card 202 to a host (e.g. host 108 in FIG. 1). In another example as shown in FIG. 2b the memory controller 106 and a plurality of memories 104 may be integrated into a SSD 206. The SSD 206 may also include an SSD Connector 208 that couples the SSD 206 to a host (e.g. host 108 in FIG. 1). In some implementations, the storage capacity and/or operating speed of the SSD 206 is greater than that of the memory card 202.

Figure 3A:
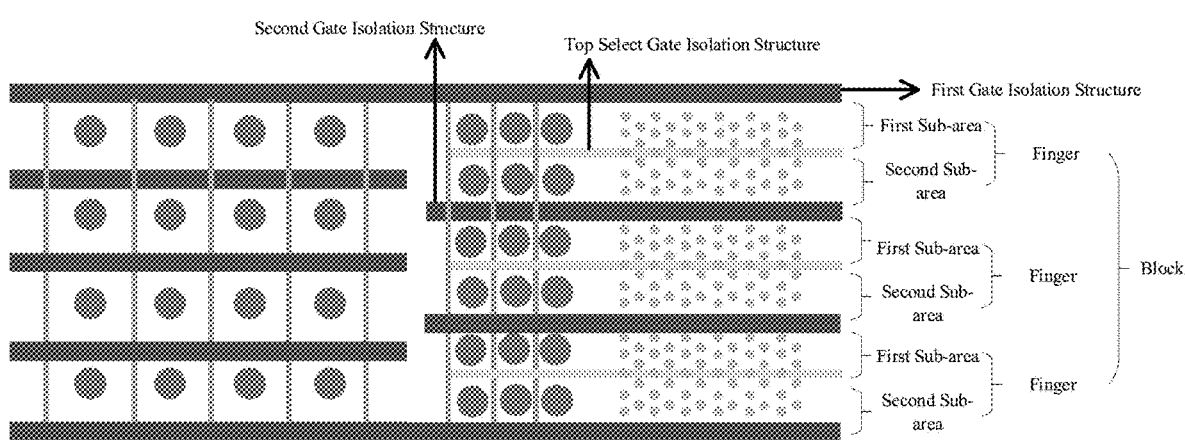
FIG. 3a is a schematic diagram of the distribution of memory cells of a three-dimensional NAND type memory according to an example of the present disclosure.

FIG. 3a illustratively shows a schematic structural diagram of a memory array of a 3D NAND type memory. As shown in FIG. 3a, the memory array of the 3D NAND type memory is composed of a plurality of parallel staggered rows of memory cells parallel to a gate isolation structure, wherein every two rows of memory cells are separated by a gate isolation structure and a top select gate isolation structure, and each row of memory cells includes a plurality of memory cells. The gate isolation structures may include a first gate isolation structure and a second gate isolation structure. The first gate isolation structure divides the memory array into a plurality of memory blocks. A plurality of second gate isolation structures may divide the memory block into a plurality of fingers, and a top select gate isolation structure arranged in the middle of each finger may divide the finger into two sub-areas. As an example, the finger includes a first sub-area and a second sub-area. One memory block shown in FIG. 3a includes six memory slices. In practical applications, the number of memory slices in one memory block is not limited thereto.

In some examples, each memory block may be coupled with a plurality of word lines. The multiple memory cells coupled with each individually controlled word line form a page. As an example, all memory cells in each memory slice in FIG. 3a are coupled to form a page.

It should be noted that the number of memory cell rows between the gate isolation structure and the top select gate isolation structure shown in FIG. 3a is an example only and not to limit the number of memory cell rows contained in one finger of the three-dimensional NAND type memory in the present disclosure. In practical applications, the number of memory cell rows included in a finger may be adjusted according to actual conditions, such as 2, 4, 8, 16, and so on.

Figure 3B:
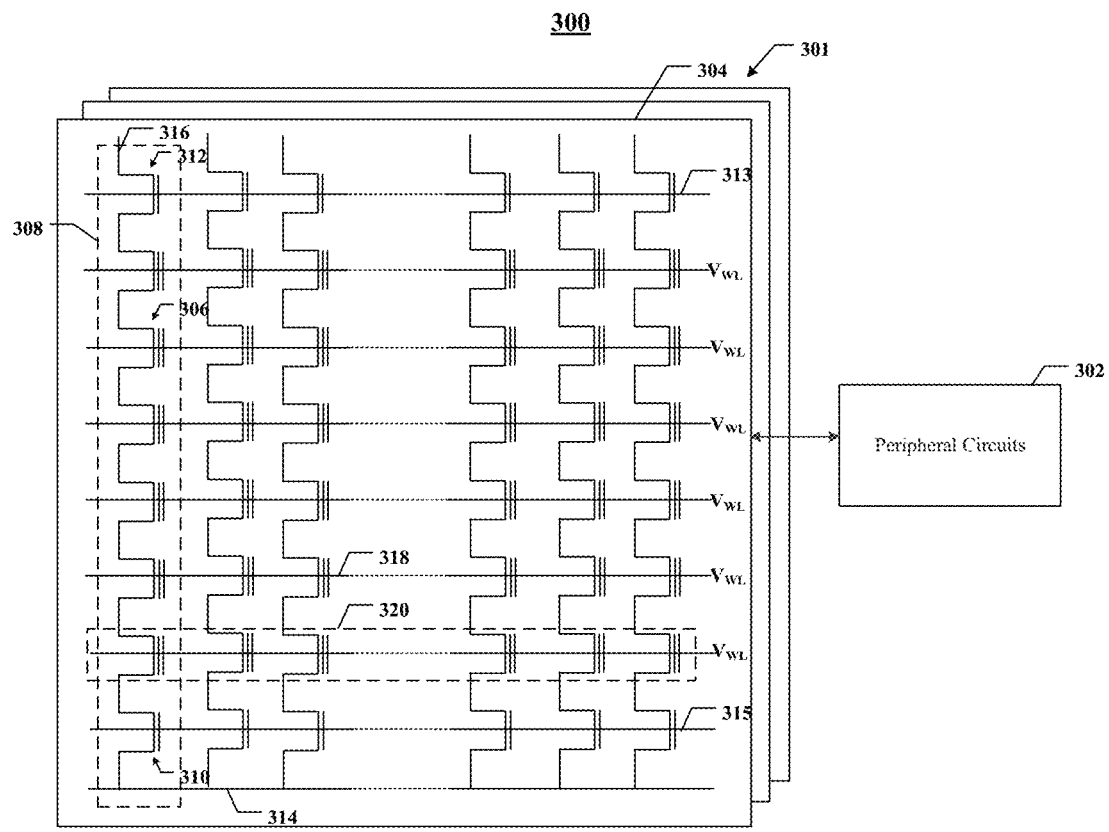
FIG. 3b is a schematic diagram of an example memory including peripheral circuits according to an example of the present disclosure.

FIG. 3b shows a schematic circuit diagram of an example memory 300 including peripheral circuits according to some aspects of the present disclosure. The memory 300 may be an example of memory 104 in FIG. 1. The memory 300 may include a memory array 301 and peripheral circuits 302 coupled to the memory array 301. The memory array 301 is illustrated as an example of a 3D NAND type memory array, wherein the memory cells 306 are provided in the form of an array of NAND memory strings 308, each NAND memory string 308 extending vertically above a substrate (not shown). In some implementations, each NAND memory string 308 includes a plurality of memory cells 306 coupled in series and stacked vertically. Each memory cell 306 may hold a continuous analog value, such as a voltage or charge, depending on the number of electrons trapped within the area of the memory cell 306. Each memory cell 306 may be a floating gate type memory cell including a floating gate transistor, or a charge trap type memory cell including a charge trap transistor.

In some implementations, each memory cell 306 is a single-level cell (SLC) that has two possible memory states and can thus store one bit of data. For example, a first memory state of "0" may correspond to a first voltage range, and a second memory state of "1" may correspond to a second voltage range. In some implementations, each memory cell 306 is a multi-level cell (MLC) capable of storing more than a single bit of data in more than four memory states. For example, MLC may store two bits per cell, three bits per cell (also known as Trinary-Level Cell (TLC)), four bits per cell (also known as Quad-Level Cell (QLC)), or five bits per cell (also known as Penta-Level cell (PLC)). Each MLC may be programmed to assume a range of possible nominal storage values. In one example, if each MLC stores two bits of data, the MLC may be programmed to take one of three possible programming levels from the erase state by writing one of three possible nominal storage values to the cell. The fourth nominal storage value may be used for the erase state.

As shown in FIG. 3b, each NAND memory string 308 may include a bottom select gate (BSG) 310 at its source terminal and a top select gate (TSG) 312 at its drain terminal. BSG 310 and TSG 312 may be configured to activate a selected NAND memory string 308 during read and program operations. In some implementations, the sources of the NAND memory strings 308 in the same memory block 304 are coupled by the same source line (SL) 314 (e.g., a common SL). In other words, according to some implementations, all NAND memory strings 308 in the same memory block 304 have an array common source (ACS). According to some implementations, TSG 312 of each NAND memory string 308 is coupled to a corresponding bit line (BL) 316, and data can be read from or written into the bit line 316 via an output bus (not shown). In some implementations, each NAND memory string 308 is configured to be selected or deselected by applying a select voltage (e.g., above a threshold voltage of a transistor with TSG 312) or a deselect voltage (e.g., 0V) to the corresponding TSG 312 via one or more TSG lines 313 and/or by applying a select voltage (e.g., above a threshold voltage of a transistor with BSG 310) or a deselect voltage (e.g., 0V) to the corresponding BSG 310 via one or more BSG lines 315.

As shown in FIG. 3b, NAND memory strings 308 may be organized into a plurality of memory blocks 304, each of which may have a common source line 314 (e.g., coupled to ground). In some implementations, each memory block 304 is the basic unit of data for an erase operation, i.e., all memory cells 306 on the same memory block 304 are erased simultaneously. To erase memory cells 306 in a selected memory block 304, an erase voltage (Vers) (e.g., a high positive voltage (e.g., 20V or higher)) may be bias coupled to the source lines 314 of the selected memory block 304 and the unselected memory block 304 on the same plane as the selected memory block 304. It should be understood that, in some examples, an erase operation may be performed at the half block level, at the quarter block level, or at any suitable number or fraction of blocks. The memory cells 306 of adjacent NAND memory strings 308 may be coupled by a word line 318 that selects which row of memory cells 306 is subject to read and program operations. In some implementations, each word line 318 is coupled to a page 320 of memory cells 306, which is the basic unit of data for a program operation. The size of a page 320 in bits may be related to the number of NAND memory strings 308 coupled by a word line 318 in one memory block 304. Each word line 318 may include a plurality of control gates (gate electrodes) at each memory cell 306 in a corresponding page 320 and a gate line coupling the control gates. In some examples, the control gates of the memory cells may extend laterally as word lines. Referring to FIG. 3a above, a page 320 includes a plurality of memory cells 306, and the plurality of memory cells are isolated by the top select gate isolation structure. The plurality of memory cells between the top select gate isolation structure and the gate isolation structure are arranged into a plurality of memory cell rows, each of which is parallel to the gate isolation structure and the top select gate isolation structure. The memory cells in a slice where they share the same word line may form a programmable (/writable) page.

Figure 3C:
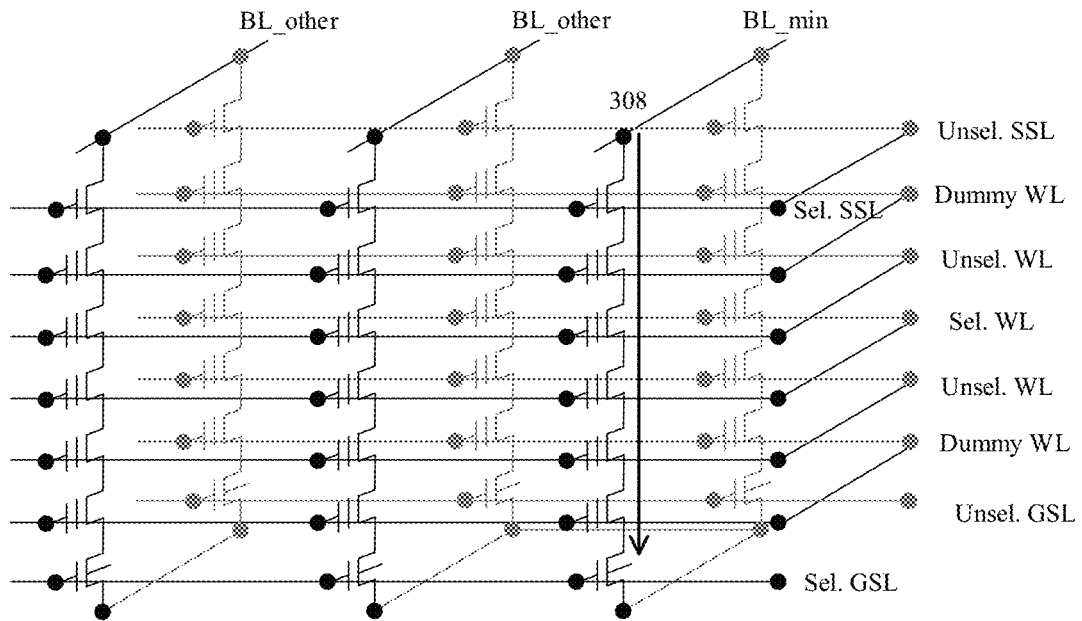
FIG. 3c is a schematic structural diagram of memory strings, word lines, bit lines in a memory according to another example of the present disclosure.

Referring to FIG. 3a, FIG. 3b and FIG. 3c, each memory cell 306 in the plurality of memory cells is coupled to a corresponding word line 318, and each memory string 308 are coupled to a corresponding bit line 316 through a corresponding select transistor (such as top select transistor (TSG) 312).

Specifically, referring to FIG. 3c, the memory may include one or more memory strings 308 (as shown by the arrow in FIG. 3c), each of which may include a top select transistor SST corresponding to a top select transistor gate line SSL, an ground select transistor GST corresponding to a bottom select transistor gate line GSL, and a plurality of memory cells located between the top select transistor and the ground select transistor. Each memory string is connected to a corresponding bit line BL and the unified common source line.

Here, referring to FIG. 3c, the word line coupled to the selected page is the selected word line (Sel. WL), which may be any word line among the multiple word lines in the memory. The other word lines are unselected word lines (Usel. WL) or dummy word lines (Dummy WL). The bit lines BL in the memory are divided into two parts: one part of the bit lines are connected with the memory cells in the lowest state (i.e., the erase state) in the memory cells coupled to the selected word line, denoted as the first bit line (BL_min); and the other part of the bit lines are connected with the memory cells except those who are in the lowest state (i.e., the erase state) and those who have reached the target state in the memory cells coupled with the selected word line, denoted as the second bit line (BL_other). In actual operation, the read and program operations may be performed by selecting a particular target memory cell in the plurality of memory cells through choosing the corresponding word line and bit line.

Figure 4:
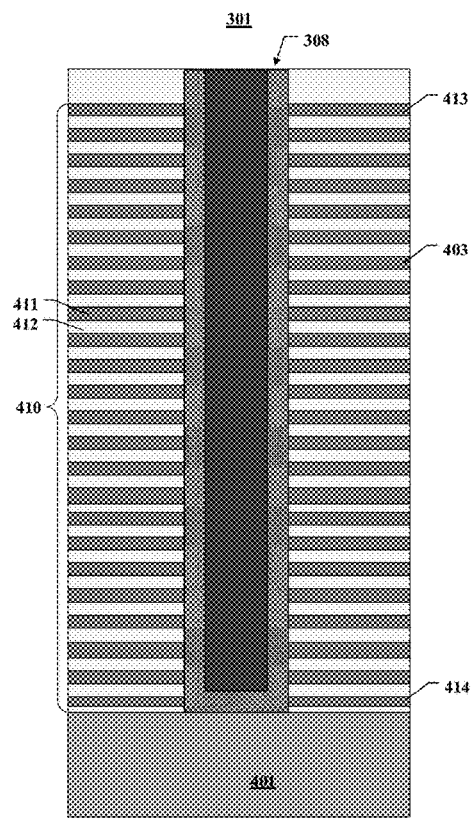
FIG. 4 is a schematic cross-sectional view of a memory array including NAND type memory strings according to an example of the present disclosure.

FIG. 4 shows a schematic cross-sectional view of an example memory array 301 including NAND memory strings 308 in accordance with some aspects of the present disclosure. As shown in FIG. 4, the NAND memory string 308 may include a stack structure 410, which includes a plurality of gate layers 411 and a plurality of insulating layers 412 alternately stacked in sequence, and memory string 308 vertically penetrating through the gate layers 411 and the insulating layers 412. The gate layers 411 and the insulating layers 412 may be stacked alternately, and two adjacent gate layers 411 are separated by an insulating layer 412. The number of pairs of gate layers 411 and insulating layers 412 in the stack structure 410 may determine the number of memory cells included in the memory array 401.

The constituent material of the gate layers 411 may include conductive material. The conductive material include, but is not limited to, tungsten (W), cobalt (Co), copper (Cu), aluminum (Al), polysilicon, doped silicon, silicide, or any combination thereof. In some implementations, each gate layer 411 includes a metal layer, such as a tungsten layer. In some implementations, each gate layer 411 includes a doped polysilicon layer. Each gate layer 411 may include a control gate surrounding a memory cell. The gate layer 411 at the top of the stack structure 410 may extend laterally as a top select gate line, and the gate layer 411 at the bottom of the stack structure 410 may extend laterally as a bottom select gate line, and a gate layers 411 extending laterally between the top select gate line and the bottom select gate line may serve as a word line layer.

In some examples, the stack structure 410 may be disposed on the substrate 401. The substrate 401 may include silicon (e.g., monocrystalline silicon), silicon germanium (SiGe), gallium arsenide (GaAs), germanium (Ge), silicon on insulator (SOI), germanium on insulator (GOI), or any other suitable material.

In some examples, the NAND memory string 308 includes a channel structure that extends vertically through the stack structure 410. In some implementations, the channel structure includes a channel hole filled with semiconductor material(s) (e.g. as a semiconductor channel) and dielectric material(s) (e.g. as a memory film). In some implementations, the semiconductor channel includes silicon, such as polysilicon. In some implementations, the memory film is a composite dielectric layer including a tunneling layer, a storage layer (also referred to as a "charge trapping/storage layer"), and a block layer. The channel structure may have a cylindrical shape (e.g. a pillar shape). According to some implementations, the semiconductor channel, the tunneling layer, the storage layer, and the block layer are arranged radially from the center of the pillar toward the outer surface of the pillar in this order. The tunneling layer may include silicon oxide, silicon oxynitride, or any combination thereof. The storage layer may include silicon nitride, silicon oxynitride, or any combination thereof. The block layer may include silicon oxide, silicon oxynitride, high dielectric constant (high k) dielectric, or any combination thereof. In one example, the memory film may include a composite layer of silicon oxide/silicon oxynitride/silicon oxide (ONO).

Figure 5:
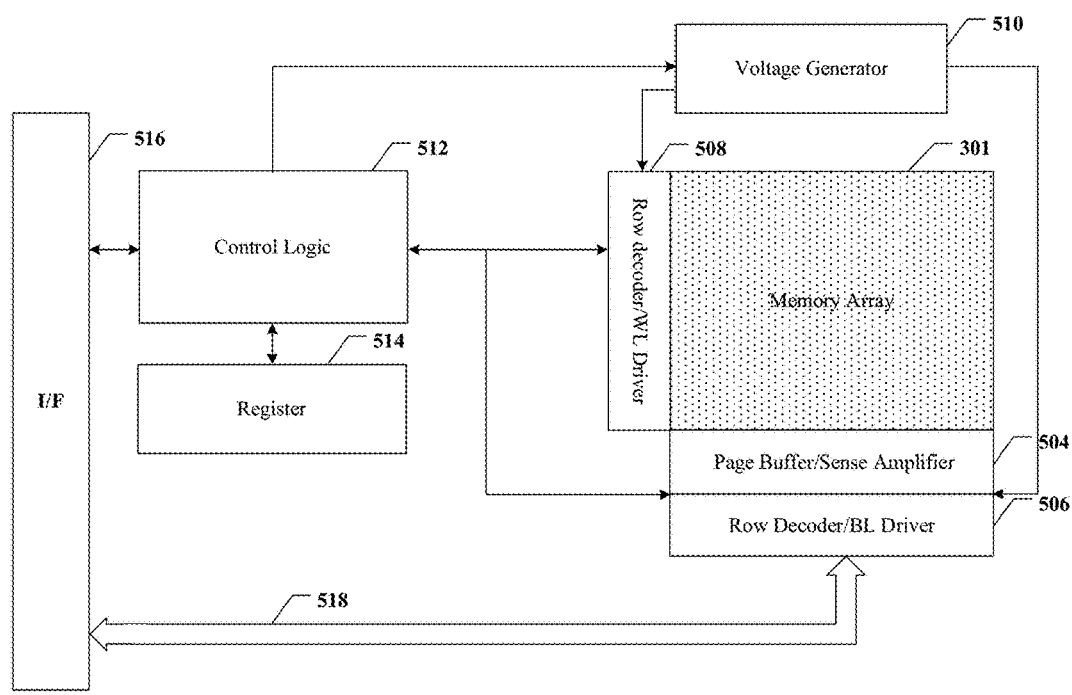
FIG. 5 is a schematic diagram of an example memory including a memory cell array and peripheral circuits according to an example of the present disclosure.

Referring back to FIG. 3b, the peripheral circuits 302 may be coupled to memory array 301 through bit lines 316, word lines 318, source lines 314, BSG lines 315, and TSG lines 313. The peripheral circuits 302 may include any suitable analog, digital, and mixed-signal circuits for applying and sensing voltage and/or current signals to/from each target memory cell 306 via bit lines 316, word lines 318, source lines 314, BSG lines 315, and TSG lines 313 to facilitate operations of the memory array 301. The peripheral circuits 302 may include various types of peripheral circuits formed using metal-oxide-semiconductor (MOS) technology. For example, FIG. 5 shows some example peripheral circuits. The peripheral circuits 302 include page buffer/sense amplifier 504, column decoder/bit line driver 506, row decoder/word line driver 508, voltage generator 510, control logic 512, register 514, interface 516 and data bus 518. It should be understood that in some examples, additional peripheral circuits not shown in FIG. 5 may also be included.

The page buffer/sense amplifier 504 may be configured to read data from and program (write) data to the memory array 301 according to control signals from control logic 512. In one example, page buffer/sense amplifier 504 may store a page of program data (write data) to be programmed into one page 320 of the memory array 301. In another example, page buffer/sense amplifier 504 may perform a program verify operation to ensure that data has been correctly programmed into the memory cells 306 coupled to a selected word line 318. In yet another example, page buffer/sense amplifier 504 may also sense a low power signal from a bit line 316 representing data bits stored in memory cells 306 and amplify the small voltage swing during a read operation to a recognizable logic level. The column decoder/bit line driver 506 may be configured to be controlled by the control logic 512 and to select one or more NAND memory strings 308 by applying bit line voltages generated from the voltage generator 510.

The row decoder/word line driver 508 may be configured to be controlled by control logic 512, and to select/deselect memory blocks 304 of the memory array 301 and select/deselect word lines 318 of the memory blocks 304. The row decoder/word line driver 508 may also be configured to drive word lines 318 using word line voltages generated from the voltage generator 510. In some implementations, the row decoder/word line driver 508 can also select/deselect and drive the BSG line 315 and the TSG line 313. As described in detail below, the row decoder/word line driver 508 is configured to perform program operations on the memory cells 306 coupled to the selected word line(s) 318. The voltage generator 510 may be configured to be controlled by control logic 512 and to generate word line voltages (e.g., read voltages, program voltages, pass voltages, channel boost voltages, verify voltages, etc.), bit line voltages and source line voltages to be supplied to memory array 301.

The control logic 512 may be coupled to each of the peripheral circuits described above and configured to control the operation of each peripheral circuit. The register 514 may be coupled to the control logic 512 and include a status register, a command register and a address register for storing status information, command operation codes (OP codes) and command addresses for controlling the operation of each peripheral circuit. The interface 516 may be coupled to the control logic 512 and act as a control buffer to buffer and relay control commands received from a host (not shown) to the control logic 512, and to buffer and relay status information received from the control logic 512 to the host. The interface 516 may also be coupled to column decoder/bit line driver 506 via data bus 518 and act as a data I/O interface and a data buffer to buffer and relay data to or from the memory array 301.

As mentioned above, in NAND type memory, according to the difference in storage density, memory cells may be divided into single-level memory cell (one-bit memory cell), double-level memory cell (two-bit memory cell), three-level memory cell (three-bit memory cell), four-level memory cell (four-bit memory cell), five-level memory cell (five-bit memory cell). However, regardless of single-level memory cell or multi-level memory cell, its read operation is performed in units of page. Specifically, when performing a read operation, a read voltage is applied to a word line coupled to a selected page in the memory (that is, a selected word line).

When the read voltage reaches threshold voltages of multiple memory cells coupled with the selected word line, or the number of memory cells whose threshold voltages have not been reached are within an allowable range, the read operation of the entire page is finished.

It should be noted that during the read operation, the memory cells whose target threshold voltages have not been reached are marked as incorrect bits. In order to prevent read errors, an error correction code (ECC) is introduced. When the number of incorrect bits is less than or equal to the maximum number of incorrect bits that can be corrected by the ECC, all incorrect bits in the read operation can be corrected, so that the correct reading of data can be realized.

Figure 6:
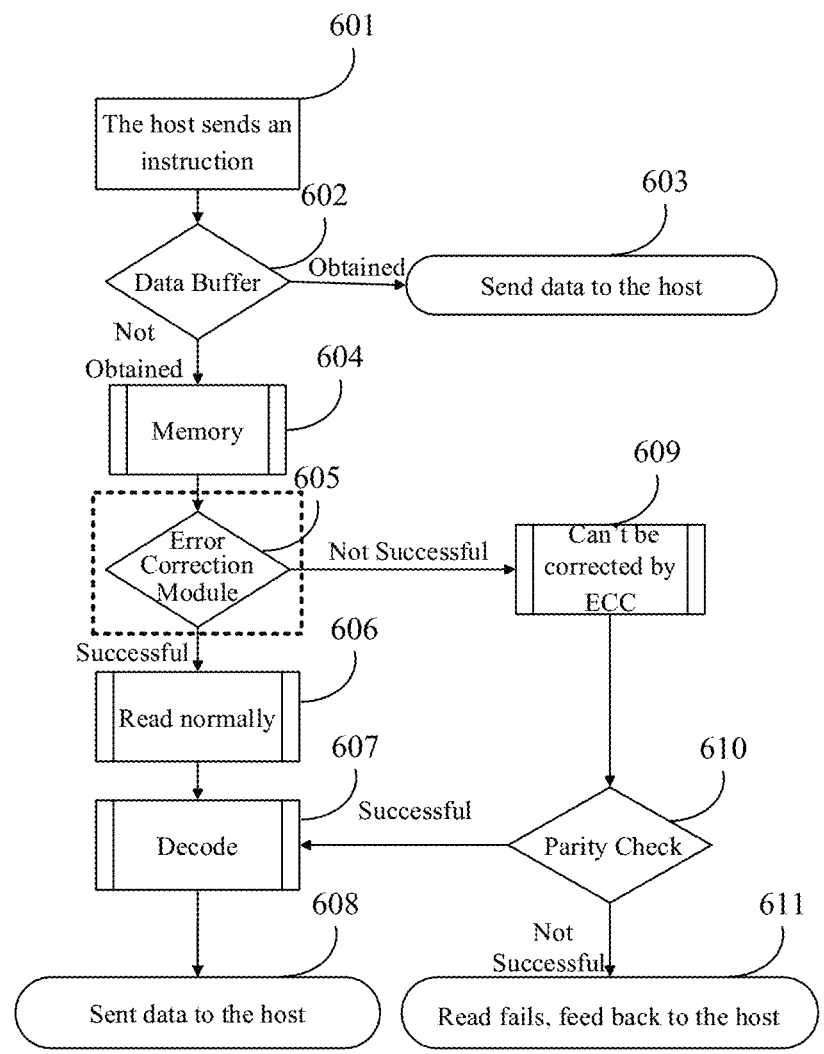
FIG. 6 is a schematic flow diagram of data reading provided by an example of the present disclosure.

Exemplarily, referring to FIG. 6, a schematic flow chart of data reading is shown. The host sends a read command to the memory controller (step 601), and the memory controller obtains the target data from the data buffer (step 602), and transmit the obtained target data to the host (step 603). When the memory controller does not obtain the data from the data buffer, the host obtains the target data from the memory (step 604). In the process of obtaining the target data from the memory, if there is a reading error, the error correction module is used to correct the read data (step 605). After the incorrect data is corrected, other data are normally read (step 606). Then the read data is decoded (step 607), and the decoded correct data is sent to the host (step 608). After correcting the read data, if the incorrect data cannot be corrected by the error correction module (step 609), parity check re-encoding is performed on the incorrect data (step 610). After performing parity check re-encoding on the incorrect data, if the read operation succeeds, step 607 is performed; otherwise, it is considered that the read operation fails, and the situation is fed back to the host (step 611).

In some examples, when the error correction module corrects the read data, it usually uses Low Density Parity Check (LDPC) code, BCH (Bose Chaudhuri Hocquenghem codes) algorithm, read retry table (RRT) algorithm and so on for error correction.

Figure 7:
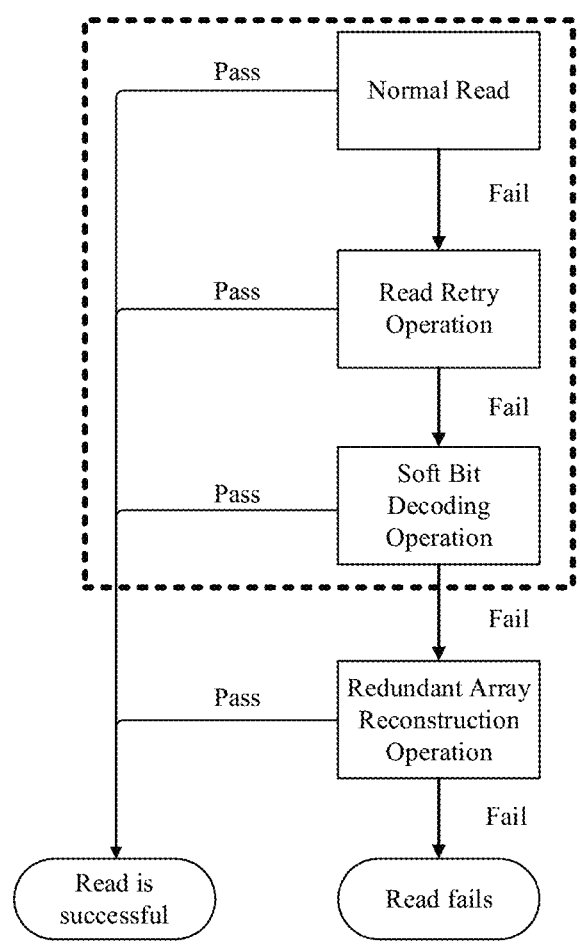
FIG. 7 is a schematic flow diagram of data error correction provided by an example of the present disclosure.

For example, referring to FIG. 7, a schematic flow diagram of data error correction is shown. The error correction flow shown in the dashed line box in FIG. 7 is the error correction process of the error correction module shown in the dashed line box in FIG. 6. Specifically, after performing a normal read operation, if the data is read incorrectly (that is, the read operation fails), a read retry operation is performed using the entire read retry table. If the read data is still incorrect after the read retry operation is performed, a soft bit decoding operation is performed. If the read data is still incorrect after the soft bit decoding operation is performed, a redundant array parity check data re-encoding is performed on the incorrect data. In the above process, if the data is read correctly in any step, it means that the reading operation passes. At this time, the correct data is fed back to the host, and the flow of error correction operation is finished.

It should be noted that, the read retry table is used widely because of its characteristics of high fitness, strong data retention capability and ease of improving read performance. For example, when data reading fails, the whole read retry table may be used to provide bias voltages for reading data, in order to attempt a read retry (i.e., performing a read retry operation), wherein these bias voltages cover such scenarios as data retention capability, read disturbance, underfilled blocks and the like.

However, with the increasing storage capacity of NAND memory, the number of bits corresponding to a memory cell is increasing. Meanwhile, there may be some problems such as poor data retention capability and read disturbance. In this case, the fitness of the whole read retry table will be reduced, and it not only increase the workload of the memory but also reduce the read performance of the memory, by polling all the entries in the whole read retry table.

In view of these, in order to solve one or more of the above problems, examples of the present disclosure provide another memory system and an operation method thereof. As shown in FIG. 8, the memory system comprises: at least one memory and a memory controller coupled to the memory; the memory comprises a plurality of word lines and a plurality of multi-bit memory cells coupled to the plurality of word lines; the memory comprises multiple types of pages; each type of page corresponds to at least one read voltage levels. As shown in FIG. 9, the operation method comprises the following steps:

S901: obtaining, when a read operation of the memory fails, a target read retry table from a set of read retry tables; wherein, each type of page in the multiple types of pages corresponds to a plurality of read retry tables; the set of read retry tables comprises all read retry tables corresponding to the multiple types of pages; a read retry table corresponding to each type of page comprises a set of bias voltages corresponding to respective read voltage levels that are used to distinguish stored data of corresponding bit;

S902: obtaining read retry voltages through the target read retry table, and performing a read retry operation using the read retry voltages.

Referring to FIG. 8, a block diagram of a memory system is shown. The memory system 801 includes: a memory controller 802 and a memory 803, both of which may be coupled in any suitable manner. In an example of the present disclosure, the memory controller 802 includes a host I/F 8021, a memory I/F 8022, a control unit 8023, an error correction (ECC) module 8024, a data buffer 8027 and an internal bus 8020, wherein the error correction module 8024 includes an encoding unit 8025 and a decoding unit 8026. The memory 803 may be a semiconductor memory that stores data non-volatilely, for example, a NAND type memory. The memory system 801 is connected to a host 804, which may be an electronic device such as a personal computer or a mobile terminal. The host I/F 8021 outputs to the internal bus 8020 commands, user data (write data), and the like received from the host 804, and transmits to the host 804 user data (read data) read from the memory 803, responses from the control unit 8023, and etc.

The memory OF 8022 controls the process of writing user data and the like to the memory 803 and the process of reading from the memory 803, based on instructions from the control unit 8023. The control unit 8023 controls the memory system 801 as a whole. The control unit 8023 is, for example, a central processing unit (CPU), a microprocessor (MPU), or the like. When receiving a command from the host 804 via the host OF 8021, the control unit 8023 performs control according to the command. For example, the control unit 8023 instructs the memory OF 8022 to write user data and parity into the memory 803 according to a command from the host 804. Also, the control unit 8023 instructs the memory OF 8022 to read user data and parity from the memory 803 in accordance with a command from the host 804.

The error correction module 8024 includes an encoding unit 8025 and a decoding unit 8026. The encoding unit 8025 encodes user data of a predetermined size written on the same page to generate parity data. The parity data is written in the page on which the user data used as the base of encoding is written, and the decoding unit 8026 decodes using the parity data. The data buffer 8027 temporarily stores user data received from the host 804 before storing it in the memory 803, and temporarily stores data read from the memory 803 before sending it to the host 804.

The memory 803 includes a plurality of word lines and a plurality of memory cells coupled to each word line; each memory cell can store one or more bits, wherein one bit of every memory cell coupled to a word line constitutes one type of page, that is, the number of bits in a memory cell is in one-to-one correspondence with the number of pages that correspond to the memory cell.

Here, the memory controller 802 controls the memory 803 to perform read and write operations. In the process of performing a read operation, no matter whether it is a one-bit memory cell or a multi-bit memory cell, one read voltage level (a read voltage) is required to be applied on the word line coupled to the corresponding memory cell in order to read the data stored in its bit(s).

In practical applications, each type of page corresponds to at least one read voltage level. For example, for one-bit memory cells, all memory cells coupled to a word line correspond to a type of page. Specifically, when writing, electrons are injected such that the amount of charge accumulated in the floating gate or charge trapping layer of the memory cell becomes the amount of charge corresponding to either of the two voltage ranges. When reading, one-bit stored data stored in the memory cell is read by applying a read voltage level for distinguishing between the two voltage ranges. In other words, when one-bit data is stored in each memory cell, one type of page corresponds to one read voltage level.

For example, for multi-bit memory cells, each type of page corresponds to two or more read voltage levels. When two-bit data is stored in every memory cell, all memory cells coupled to a word line may be divided into two types of pages (e.g., an upper page and a lower page). The two-bit data stored in the memory cell corresponds to four states (one erase state and three store states). When reading, three read voltage levels are required to distinguish between the voltage ranges corresponding to the four states, in which one type of page corresponds to a read voltage level while the other type of page corresponds to two read voltage levels.

When three-bit data is stored in every memory cell, all memory cells coupled to a word line may be divided into three types of pages (e.g., an upper page, a middle page and a lower page). The three-bit data stored in the memory cell corresponds to eight states (one erase state and seven store states). When reading, seven read voltage levels are required to distinguish between the voltage ranges corresponding to the eight states, in which one type of page corresponds to two read voltage levels, one type of page corresponds to three read voltage levels and one type of page corresponds to two read voltage levels.

When four-bit data is stored in every memory cell, all memory cells coupled to a word line may be divided into four types of pages (e.g., an upper page, a middle-up page, a middle-low page and a lower page). The four-bit data stored in the memory cell correspond to sixteen store states. When reading, fifteen read voltage levels are required to distinguish between the voltage ranges corresponding to the sixteen states (one erase state and fifteen store states), wherein one type of page corresponds to four read voltage levels, one type of page corresponds to three read voltage levels, one type of page corresponds to four read voltage levels and one type of page corresponds to four read voltage levels, and so on.

The correspondence between the number of read voltage levels and the multiple types of pages corresponding to a memory cell is further described in detail below. It should be noted that an example where each memory cell is a multi-bit memory cell is used herein and below in order to more clearly describe the example concepts of the present disclosure. It should be noted, however, that the number of bits in a memory cell in the examples of the present disclosure is intended to be illustrative only and is not intended to limit the scope of the present disclosure.

In some examples, the memory cell includes M bits. The memory includes M types of pages. The M-bit stored data of the M-bit memory cell is read through N read voltage levels, wherein M, N are each an integer greater than 1 and $N=2M-1$.

When $M=2$, the stored data in the memory cell includes two bits. At this time, the memory includes two types of pages, i.e., the upper page and the lower page. The two-bit stored data of the two-bit memory cell needs to be read through three ($3=2^2-1$) read voltage levels. For example, the two-bit data stored in a memory cell corresponds to four states (one erase state and three store states), i.e., four voltage ranges are assigned to four data values. When reading, the two-bit stored data stored in the memory cell is read by applying three read voltage levels for distinguishing between the four voltage ranges. The upper page corresponds to one read voltage level and the lower page corresponds to two read voltage levels.

When $M=3$, the stored data in the memory cell includes three bits. At this time, the memory cell includes three types of pages, namely, the upper page, the middle page and the lower page. The three-bit stored data of the three-bit memory cell needs to be read through seven ($7=2^3-1$) read voltage levels. For example, the three-bit data stored in a memory cell corresponds to eight states (one erase state and seven store states), i.e., the eight voltage ranges are assigned to eight data values. When reading, the three-bit stored data stored in the memory cell is read by applying seven read voltage levels for distinguishing between the eight voltage ranges. The upper page corresponds to two read voltage levels, the middle page corresponds to three read voltage levels, and the lower page corresponds to two read voltage levels.

When $M=4$, the stored data in the memory cell includes four bits. At this time, the memory includes four types of pages, namely, the upper page, the middle-up page, the middle-low page, and the lower page. The four-bit memory cell corresponds to fifteen ($15=2^4-1$) read voltage levels to read its four-bit data. As an example, the four-bit data stored in the memory cell corresponds to sixteen states (one erase state and fifteen store states), that is, sixteen voltages ranges are assigned to sixteen data values. When reading, the four-bit stored data stored in the memory cell is read by applying fifteen read voltage levels for distinguishing between the sixteen voltage ranges. The upper page corresponds to four read voltage levels, the middle-up page corresponds to three read voltage levels, the middle-low page corresponds to four read voltage levels, and the lower page corresponds to four read voltage levels.

To facilitate understanding of the example concepts of the present disclosure, an example where a memory cell is a three-level memory cell (TLC, three-bit memory cell) is used here and below for describing.

Next, referring to FIG. 9, step S901 is executed, obtaining the target read retry table from the set of read retry tables, after the read operation fails.

It should be noted that the set of read retry tables here is provided by the memory device manufacturer and stored in a storage element of the memory, for example in firmware. In actual operations, according to different test items, the set of read retry tables may be divided into a plurality of general read retry tables. Each general read retry table may correspond to all read voltage levels in the three-bit memory cells. Exemplarily, referring to FIG. 10a and FIG. 11a, wherein FIG. 10a shows a first set of read retry tables corresponding to the case where the plurality of memory blocks in the memory are filled, and FIG. 11a shows a second set of read retry tables corresponding to the case where a part of the memory blocks in the memory are underfilled. Depending on different test items, the first set of read retry tables may include 29 general read retry tables (RR-1 to RR-29), and the second set of read retry tables may include 28 general read retry tables (RR-1 to RR-28). A7 to n7 in the dotted line box shown in FIG. 10a or FIG. 11a constitute a general read retry table (such as RR-7), and each general read retry table includes seven sets of bias voltages for differentiating between ranges of seven read voltage levels (e.g., Rd1LP, Rd2MP, Rd3UP, Rd4MP, Rd5LP, Rd6MP, Rd7UP).

In some examples, the test item includes at least one of the following: read disturbance; data retention; operation life; temperature.

The test contents corresponding to each test item in the actual operation process may be at least one of the following: Low Temperature Data Retention (LTDR), High Temperature Data Retention (HTDR), High Temperature Operation Life (HTOL), Low Temperature Operation Life (LTOL), Post cycling High Temperature Data Retention (PCHTDR).

Here, each of the test items corresponding to the first set of read retry tables may be divided, according to the cycle life of memory cell (such as the number of program/erase cycles (PE cycle)), into Beginning of Life (BOL) detection, End Of Life (EOL) detection and Fresh detection. Each of the test items corresponding to the second set of read retry tables may be divided into BOL and EOL according to the cycle life of memory cell.

It should be understood, however, that the effects of threshold voltage shift due to different problems corresponding to different test items described above may be different. For example, the threshold voltage shift due to read disturbance mainly affects the lower page of the memory cell; while the threshold voltage shift due to the weakening of data retention mainly affects the upper page of the memory cell. Therefore, repeated polling of the set of read retry tables in the presence of both read disturbance and weakened data retention results in a decrease in the efficiency of the read retry operation and a decrease in the read performance of the memory system.

In view of this, in the examples of the present disclosure, the set of read retry tables is arranged as multiple subsets of read retry tables according to the multiple types of pages corresponding to a memory cell, wherein each subset of read retry tables corresponds to each type of page. Each subset of read retry tables includes multiple read retry tables, each of which includes bias voltages corresponding to a portion of read voltage levels (levels corresponding to each type of page), so that for the threshold voltage shift due to different problems, only the subset of read retry tables corresponding to the type of page is polled, making the polling of the set of read retry tables more targeted, which can improve the fitness of the read retry tables, thereby improving the efficiency of the read retry operation and improving the read performance of the memory system.

Exemplarily, references are made to FIGS. 10a, 10b, 10c and 10d or FIGS. 11a, 11b, 11c and 11d. FIG. 10a is a set of read retry tables, while FIGS. 10b, 10c and 10d together are another set of read retry tables. FIG. 11a is a set of read retry tables, while FIGS. 11b, 11c and 11d together are another set of read retry tables. It can be seen that in the set of read retry tables shown in FIG. 10a and FIG. 11a, only one general read retry table is shown in the dotted line box, wherein each general read retry table corresponds to a set of bias voltages corresponding to seven read voltage levels, and when performing a reading operation, all read voltage levels of each general read retry table needs to be adjusted together. The set of read retry tables shown in FIGS. 10b, 10c and 10d together and shown in FIGS. 11b, 11c and 11d together includes multiple subsets of read retry tables corresponding to the upper page, the middle page and the lower page, respectively. Each subset of read retry tables is managed separately. A read retry table corresponding to the lower page includes a set of bias voltages corresponding to the first read voltage level and the fifth read voltage level, as shown in the dotted line box in FIG. 10b and FIG. 11b. A read retry table corresponding to the middle page includes a set of bias voltages corresponding to the second read voltage level, the fourth read voltage level and the sixth read voltage level, as shown in the dotted line boxes in FIG. 10c and FIG. 11c. A read retry table corresponding to the upper page includes a set of bias voltages corresponding to the third read voltage level and the seventh read voltage level, as shown in the dotted line boxes in FIG. 10d and FIG. 11d. Here, each read retry table corresponds to a set of bias voltages corresponding to a portion of read voltage levels, and when performing a read operation, each read retry table may adjust the read voltage in units of type of page.

As an example, referring to FIGS. 10a, 10b, 10c, 10d, and FIGS. 11a, 11b, 11c, 11d, in the multiple three-bit memory cells (TLC) coupled to one word line, each memory cell corresponds to a Upper Page (UP), a Middle Page (MP) and a Lower Page (LP), and each memory cell corresponds to seven read voltage levels, where the seven read voltage levels include: the first read voltage level (Rd1LP), the second read voltage level (Rd2MP), the third read voltage level (Rd3UP), the fourth read voltage level (Rd4MP), the fifth read voltage level (Rd5LP), the sixth read voltage level (Rd6MP), the seventh read voltage (Rd7UP). Here, a subset of read retry tables corresponding to the lower page includes multiple read retry tables, wherein the test item corresponding to each read retry table is different, and wherein each read retry table corresponds to bias voltages corresponding to the first read voltage level (Rd1LP) and the fifth read voltage level (Rd5LP). For example, in the dotted line box shown in FIG. 10b or FIG. 11b, a7, b7, i7 and j7 constitute a read retry table (such as RR-7). A subset of read retry tables corresponding to the middle page includes multiple read retry tables, wherein the test item corresponding to each read retry table is different, and wherein each read retry table corresponds to a set of bias voltages corresponding to the second read voltage level (Rd2MP), the fourth read voltage level (Rd4MP) and the sixth read voltage level (Rd6MP). For example, in the dotted line box shown in FIG. 10c or FIG. 11c, c7, d7, g7, h7, k7 and l7 constitute a read retry table (such as RR-7). A subset of read retry tables corresponding to the upper page includes multiple read retry tables, wherein the test item corresponding to each read retry table is different, and wherein each read retry table corresponds to a set of bias voltages corresponding to the third read voltage level (Rd3UP) and the seventh read voltage level (Rd7UP). For example, in the dotted line box shown in FIG. 10d or FIG. 11d, e7, f7, m7 and n7 constitute a read retry table (such as RR-7). As such, only the read retry tables corresponding to the lower page is polled to obtain the corresponding bias voltages, when the lower page of the memory cell is affected by the threshold voltage shift due to read disturbance. It is also possible to poll the read retry tables corresponding to the upper page only, to obtain the corresponding bias voltages, when the upper page of the memory cell is affected by the threshold voltage shift due to the weakened data retention. It is also possible to poll the read retry tables corresponding to the upper page and the lower page to obtain the corresponding bias voltages, when the read disturbance and weakened data retention occur at the same time.

In other words, in the above example, when the read operation fails due to different problems and the read retry operation is performed, it is only necessary to poll the read retry tables corresponding to one type of page or several types of pages among the lower page/middle page/upper page, to obtain the corresponding bias voltages, and then perform a read retry operation according to the bias voltages to obtain the read data. In this way, the read retry efficiency and the fitness of the read retry table can be improved, thereby improving the read performance of the memory.

It should be noted that the test items corresponding to each of the read retry tables in FIGS. 10b, 10c and 10d are the same as the test items corresponding to the first set of read retry tables in FIG. 10a; and the test items corresponding to each of the read retry tables in FIGS. 11b, 11c and 11d are the same as the test items corresponding to the second set of read retry tables in FIG. 11a; and the test items have been discussed before and will not be repeated here.

In some examples, obtaining the target read retry table from the set of read retry tables includes: determining, according to a test item underwent by the memory, at least one type of page affected by the test item; and obtaining the target read retry table from the read retry tables corresponding to the affected at least one type of page.

As an example, according to the cause of the failure of the read operation (such as read disturbance, weakened data retention), the shifting of the threshold voltage for each type of page in the memory cell during the read operation is determined, and the target page in the memory cell on which read retry needs to be performed is determined according to the shifting of the threshold voltage, and a target read retry table corresponding to the target page is obtained.

In some examples, the method further includes: obtaining bias voltages corresponding to the respective read voltage levels according to the target read retry table; obtaining the read retry voltages by adding the read voltages when the read operation fails and the bias voltages.

As an example, according to the target read retry table, the target page corresponding to the target read retry table is determined, and the bias voltages corresponding to the respective read voltage levels corresponding to the target page are obtained. Next, the bias voltages are added with the read voltages when the read operation fails to obtain read retry voltages. Finally, a read retry operation is performed using the read retry voltages. It should be noted that due to the different conditions that affect the threshold voltage shift, the threshold voltage may shift upwards or downwards. Therefore, some bias voltages are to increase on the basis of the original read voltage, and some bias voltages are to decrease on the basis of the original read voltage. In this way, in this example, by compensating the original read voltage with the bias voltage, the fitness of the read retry tables can be improved on the one hand, and the polling operation can be performed only on the target read retry table that affects the target page on the other hand, thereby reducing the process of polling non-target read retry tables during read retry operations, thereby improving the efficiency of the read retry operation.

In some examples, for a read retry table corresponding to each type of page, the respective read voltage levels that are used to distinguish stored data of corresponding bit are determined according to encoding rules. As an example, the encoding rules include but are not limited to Gray Code encoding rules. It should be noted that a typical binary Gray Code is usually referred to as Gray Code for short. In the encoding of a group of numbers, if any two adjacent codes are different only in one binary number, this code is called Gray Code. Further, since the maximum and minimum are also different only in one binary number, i.e., "end-to-end", it is also called cyclic code or reflective code. Gray Code also has many other encoding forms, such as decimal number encoding form, four-bit natural binary encoding form, etc. Gray Code produces a code table through recursion, such as, two-bit Gray Code, three-bit Gray Code, four-bit Gray Code, etc. For example, referring to FIG. 12, three-bit Gray Code is shown, such as 111, 110, 100, 000, 101, 011, 001, and 101, which correspond to one erase state (ER) and seven program states (P1-P7), respectively. As mentioned earlier, reading eight voltage ranges corresponding to eight states (one erase state and seven program states) requires seven read voltage levels. In the examples of the present disclosure, the three types of pages corresponding to the three-bit memory cell correspond to the seven read voltage levels respectively, through the encoding rules of the three-bit Gray Code. Wherein, a read retry table corresponding to the lower page corresponds to a set of bias voltage corresponding to the first read voltage level and the fifth read voltage level; a read retry table corresponding to the middle page corresponds to a set of bias voltages corresponding to the second read voltage level, the fourth read voltage level, and the sixth read voltage level; a read retry table corresponding to the upper page corresponds to a set of bias voltages corresponding to the third read voltage level and the seventh read voltage level. It should be noted that after the encoding rule is changed, the number of corresponding levels is adjusted accordingly.

In some examples, the method further includes managing read retry tables corresponding to different types of pages respectively, using different areas of a storage element in the memory.

Here, a plurality of read retry tables in the set of read retry tables are stored in a storage element of a memory, such as firmware. In the examples of the present disclosure, a plurality of read retry tables corresponding to the upper page are stored in the first area of the storage element, a plurality of read retry tables corresponding to the middle page are stored in the second area of the storage element, and a plurality of read retry tables corresponding to the lower page are stored in the third area of the storage element. Thus, different areas of the storage element in the memory may manage the read retry tables corresponding to different types of pages respectively, thereby improving the flexibility of the read retry tables.

It should be noted that, in the process of performing the read retry operation, there may be the case where the read retry tables corresponding to some test items are used frequently while the remaining read retry tables are used infrequently. In view of this, in some examples the method further includes: in the process of obtaining the target read retry table from the set of read retry tables, obtaining, as the target read retry table, a read retry table from a plurality of read retry tables corresponding to each type of page using a Least Recently Used (LRU) algorithm.

Here, the LRU algorithm eliminates data according to the historical records of data access, and its core idea is "if data has been accessed recently, its probability of being accessed in the future is higher". Based on this, in the examples of the present disclosure, the LRU algorithm is used to adjust the order of a plurality of read retry tables corresponding to each type of page, that is, the read retry table with the most access times in the historical access record is set as the read retry table to be first polled (the optimal read table). As an example, referring to FIG. 13, the process of executing the LRU algorithm in FIG. 13 includes two parts: an LRU operation stage and an LRU result. In the LRU operation stage, the read retry tables with higher polling frequency (such as Table52, Table7, Table54, Table55, etc.) among a plurality of read retry tables (such as initial read retry tables Table1-Table55) corresponding to each type of page are placed at the foremost position of the sequence by the LRU algorithm, wherein each table here may be understood as a read retry table (such as RR-1) in the aforementioned examples. A plurality of read retry tables with high frequency of use are obtained by a plurality of calculations (#1-#4), and then the plurality of read retry tables with higher frequency of polling are sorted again according to the principle that the frequency of use is gradually reduced, and the sorted result is fed back into an LRU result (#5). Based on this, in performing the read retry operation, a plurality of read retry tables with higher polling frequency in the LRU result are taken as the focus acquisition objects, and a read retry table with the highest polling frequency is taken as the target read retry table from the focus acquisition objects. Thus, the fitness of the read retry table and the efficiency of the read retrying operation can be improved.

It should be noted that after any one of the plurality of read retry tables corresponding to each type of page is polled as the target read retry table, the system will directly jump out of the current read retry operation and end the polling of the read retry tables corresponding to this type of page, that is, the read retry operation is finished.

However, after the read retry operation is finished, there may still be cases where the correct data cannot be read out after the read retry operation. In view of this, in some examples, the method further includes: perform a soft bit decoding operation when the read retry operation fails; and perform a redundant array re-encoding operation when the soft bit decoding operation fails.

The soft bit decoding operation may be understood as performing re-decoding of data by a decoding unit (such as a soft decoder) in the memory controller, and performing a read operation again according to the re-decoded data. It should be noted that, when performing the soft bit operation, in the above example, each type of page is associated with a plurality of read retry tables. On the one hand, it can improve the execution of the soft bit operation to determine the read level of top priority among the plurality of read tables. On the other hand, it may determine the information of multiple pages more quickly when the soft decoder reads multiple bits in each memory cell, and the read level of top priority among the plurality of read tables may be determined more quickly according to the optimal read table, thereby improving the read efficiency of the memory system.

After the soft bit decoding operation, there may still be cases where the correct data cannot be read out. In view of this, in the examples of the present disclosure, after the soft bit decoding operation fails, the redundant array re-encoding operation is performed. The redundant array re-encoding operation is performed on the stored data to improve the accuracy of data reading. Here, the redundant array reconstruction operation may be understood as reconstructing stored data and its parity data by realizing the data mirroring through two-pass encoding. Usually the redundant array re-encoding of stored data is performed in the data buffer of the memory controller. The technology of redundant array re-encoding operation in the related art is relatively mature, and will not be repeated here.

Based on this, in the examples of the present disclosure, when the read operation of the memory fails, a set of read retry tables is obtained, wherein the set of read retry tables includes all read retry tables corresponding to multiple types of pages of the memory, a read retry table corresponding to each type of page includes a set of bias voltages corresponding to the respective read voltage levels that are used to distinguish the storage data of the corresponding bit. Then, a target read retry table is obtained from the set of read retry tables, and the read retry voltages are obtained through the target read retry table, and finally the read retry operation is performed using the read retry voltages. In other words, in the examples of the present disclosure, in the process of obtaining the target read retry table from the set of read retry tables, the set of read retry tables is arranged as multiple subsets of read retry tables corresponding to multiple types of pages, according to the multiple types of pages corresponding to the memory cell. Each subset of read retry tables includes a plurality of read retry tables corresponding to this type of page, and each read retry table includes bias voltages corresponding to a portion of read voltage levels (levels corresponding to each type of page). In this way, for the threshold value shift due to different problems, only the subset of read retry tables corresponding to this type of page is polled, that is, the process of polling the non-target read retry tables during the read retry operation is reduced, so that the polling of the set of read retry tables is more targeted when performing the read retry operation. In this way, the efficiency of the read retry operation can be improved, the fitness of the read retry tables can be improved, and the read performance of the memory system can be improved.

Based on the above operation method of the memory system, the examples of the present disclosure further provide a memory system, comprising: at least one memory and a memory controller coupled to the memory; the memory comprises a plurality of word lines and a plurality of multi-bit memory cells coupled to the plurality of word lines; the memory comprises multiple types of pages; each type of page corresponds to at least one read voltage level; the memory controller is configured to:
    obtain, when an read operation of the memory fails, a target read retry table from a set of read retry tables; wherein, each type of page in the multiple types of pages corresponds to a plurality of read retry tables; the set of read retry tables comprises all read retry tables corresponding to the multiple types of pages; a read retry table corresponding to each type of page comprises a set of bias voltages corresponding to respective read voltage levels that are used to distinguish stored data of corresponding bit;

obtain read retry voltages through the target read retry table, and perform a read retry operation using the read retry voltages.

In some examples, the memory cell comprises M bits, the memory comprises M types of pages, and the M-bit stored data of the M-bit memory cell is read through N read voltage levels; M and N are each integers greater than 1, and N=2M−1; the respective read voltage levels that are used to distinguish the stored data of the corresponding bit for a read retry table corresponding to each type of page are determined according to encoding rules.

In some examples, the memory cell comprises three bits, the memory comprises an upper page, a middle page, and a lower page, and the three-bit stored data of the three-bit memory cell is read through seven read voltage levels; the set of read retry tables comprises a plurality of read retry tables corresponding to the upper page, the middle page, and the lower page, respectively; a read retry table corresponding to the lower page comprises a set of bias voltages corresponding to the first read voltage level and the fifth read voltage level; a read retry table corresponding to the middle page comprises a set of bias voltages corresponding to the second read voltage level, the fourth read voltage level, and the sixth read voltage level; a read retry table corresponding to the upper page comprises a set of bias voltages corresponding to the third read voltage level and the seventh read voltage level.

In some examples, the memory further comprises a storage element;

the plurality of read retry tables corresponding to the upper page are stored in the first area of the storage element; the plurality of read retry tables corresponding to the middle page are stored in the second area of the storage element; the plurality of read retry tables corresponding to the lower page are stored in the third area of the storage element; wherein the first area, the second area and the third area are different management areas in the storage element.

In some examples, the plurality of read retry tables corresponding to each type of page comprise multiple sets of bias voltages corresponding to different test items;

the memory controller is configured to: in the process of obtaining the target read retry table from the set of read retry tables, determine, according to a test item underwent by the memory, at least one type of page affected by the test item; and obtain the target read retry table from the read retry table corresponding to the affected at least one type of page.

In some examples, the test item comprises at least one of the following: read disturbance; data retention; operation life; temperature.

In some examples, the memory controller is configured to: in the process of obtaining the target read retry table from the set of read retry tables, obtain, as the target read retry table, a read retry table from the plurality of read retry tables corresponding to each type of page using a least recently used LRU algorithm.

In some examples, the memory controller is configured to: obtain bias voltages corresponding to the respective read voltage levels according to the target read retry table; obtain the read retry voltages by adding the read voltages when the read operation fails and the bias voltages.

In some examples, the memory controller is further configured to: perform a soft bit decoding operation when the read retry operation fails; perform a redundant array re-encoding operation when the soft bit decoding operation fails.

In some examples, the memory system comprises a universal flash memory UFS device or a solid state disk (SSD).

The examples of the present disclosure also provide an electronic device comprising: one or more memory systems as described in the above examples of the present disclosure.

It should be understood that references to "one example" or "an example" throughout the specification mean that particular features, structure or characteristics related to the example are included in at least one example of the present disclosure. Thus, the phrase "in one example" or "in an example" appearing throughout the specification do not necessarily refer to the same example. In addition, these particular features, structure or characteristics may be incorporated in one or more examples in any suitable manner. It should be understood that in the various examples of the present disclosure, the sequence number of the processes described above does not imply that the sequence of execution of the processes, which should be determined by their functions and inherent logic and should not constitute any limitation on the implementation process of the examples of the present disclosure. The above sequence number of examples of present disclosure are for description only and do not represent the advantages and disadvantages of the example.

In view of these, examples of the present disclosure provide a memory system, an operation method thereof, and an electronic device. The memory system comprises: at least one memory and a memory controller coupled to the memory; the memory comprises a plurality of word lines and a plurality of multi-bit memory cells coupled to the plurality of word lines; the memory comprises multiple types of pages; each type of page corresponds to at least one read voltage level;

the memory controller is configured to:
obtain, when a read operation of the memory fails, a target read retry table from a set of read retry tables; wherein, each type of page in the multiple types of pages corresponds to a plurality of read retry tables; the set of read retry tables comprises all read retry tables corresponding to the multiple types of pages; a read retry table corresponding to each type of page comprises a set of bias voltages corresponding to respective read voltage levels that are used to distinguish stored data of corresponding bit;
obtain read retry voltages through the target read retry table, and perform a read retry operation using the read retry voltages.

In the above solution, the memory cell comprises M bits, the memory comprises M types of pages, and the M-bit stored data of the M-bit memory cell is read through N read voltage levels; M and N are each integers greater than 1, and N=2M−1;

the respective read voltage levels that are used to distinguish the stored data of the corresponding bit for a read retry table corresponding to each type of page are determined according to encoding rules.

In the above solutions, the memory cell comprises three bits, the memory comprises an upper page, a middle page, and a lower page, and the three-bit stored data of the three-bit memory cell is read through seven read voltage levels;

the set of read retry tables comprises a plurality of read retry tables corresponding to the upper page, the middle page, and the lower page, respectively; a read retry table corresponding to the lower page comprises a set of bias voltages corresponding to the first read voltage level and the fifth read voltage level; a read retry table corresponding to the middle page comprises a set of bias voltages corresponding to the second read voltage level, the fourth read voltage level, and the sixth read voltage level; a read retry table corresponding to the upper page comprises a set of bias voltages corresponding to the third read voltage level and the seventh read voltage level.

In the above solutions, the memory further comprises a storage element;
the plurality of read retry tables corresponding to the upper page are stored in a first area of the storage element; the plurality of read retry tables corresponding to the middle page are stored in a second area of the storage element; the plurality of read retry tables corresponding to the lower page are stored in a third area of the storage element;
wherein the first area, the second area and the third area are different management areas in the storage element.

In the above solutions, the plurality of read retry tables corresponding to each type of page comprise multiple sets of bias voltages corresponding to different test items;
the memory controller is configured to:
in the process of obtaining the target read retry table from the set of read retry tables, determine, according to a test item underwent by the memory, at least one type of page affected by the test item; and obtain the target read retry table from the read retry tables corresponding to the affected at least one type of page.

In the above solutions, the test item comprise at least one of the following:
read disturbance;
data retention;
operation life;
temperature.

In the above solutions, the memory controller is configured to:
in the process of obtaining the target read retry table from the set of read retry tables, obtain, as the target read retry table, a read retry table from the plurality of read retry tables corresponding to each type of page using a least recently used LRU algorithm.

In the above solutions, the memory controller is configured to:
obtain bias voltages corresponding to the respective read voltage levels according to the target read retry table;
obtain the read retry voltages by adding the read voltages when the read operation fails and the bias voltages.

In the above solutions, the memory controller is further configured to:
perform a soft bit decoding operation when the read retry operation fails;
perform a redundant array re-encoding operation when the soft bit decoding operation fails.

In the above solutions, the memory system comprises a universal flash memory (UFS) device or a solid state disk.

The examples of the present disclosure further provide an operation method of a memory system, wherein the memory system comprises: at least one memory and a memory controller coupled to the memory; the memory comprises a plurality of word lines and a plurality of multi-bit memory cells coupled to the plurality of word lines; the memory comprises multiple types of pages; each type of page corresponds to at least one read voltage level;
the operation method comprises:

obtaining, when a read operation of the memory fails, a target read retry table from a set of read retry tables; wherein, each type of page in the multiple types of pages corresponds to a plurality of read retry tables; the set of read retry tables comprises all read retry tables corresponding to the multiple types of pages; a read retry table corresponding to each type of page comprises a set of bias voltages corresponding to respective read voltage levels that are used to distinguish stored data of corresponding bit;
obtaining read retry voltages through the target read retry table, and performing a read retry operation using the read retry voltages.

In the above solution, the memory cell comprises M bits, the memory comprises M types of pages, and the M-bit stored data of the M-bit memory cell is read through N read voltage levels; M and N are each integers greater than 1, and N=2M−1;
the respective read voltage levels that are used to distinguish the stored data of the corresponding bit for a read retry table corresponding to each type of page are determined according to encoding rules.

In the above solutions, the memory cell comprises three bits, the memory comprises an upper page, a middle page, and a lower page, and the three-bit stored data of the three-bit memory cell is read through seven read voltage levels:
the set of read retry tables comprises a plurality of read retry tables corresponding to the upper page, the middle page, and the lower page, respectively; a read retry table corresponding to the lower page comprises a set of bias voltages corresponding to the first read voltage level and the fifth read voltage level; a read retry table corresponding to the middle page comprises a set of bias voltages corresponding to the second read voltage level, the fourth read voltage level, and the sixth read voltage level; a read retry table corresponding to the upper page comprises a set of bias voltages corresponding to the third read voltage level and the seventh read voltage level.

In the above solutions, the method further comprises:
managing the read retry tables corresponding to different types of pages respectively, using different areas of a storage element in the memory.

In the above solutions, obtaining the target read retry table from the set of read retry tables comprises:
determine, according to a test item underwent by the memory, at least one type of page affected by the test item; and
obtain the target read retry table from the read retry tables corresponding to the affected at least one type of page.

In the above solutions, the method further comprises:
in the process of obtaining the target read retry table from the set of read retry tables, obtain, as the target read retry table, a read retry table from the plurality of read retry tables corresponding to each type of page using a least recently used (LRU) algorithm.

In the above solutions, the plurality of read retry tables corresponding to each type of page comprise multiple sets of bias voltages corresponding to different test items;
the method further comprises:
obtaining bias voltages corresponding to the respective read voltage levels according to the target read retry table;
obtaining the read retry voltages by adding the read voltages when the read operation fails and the bias voltages.

In the above solutions, the method further comprises:
perform a soft bit decoding operation when the read retry operation fails;
perform a redundant array re-encoding operation when the soft bit decoding operation fails.

The examples of the present disclosure further provide an electronic device comprising: one or more memory systems according to the above examples of the present disclosure.

In the examples of the present disclosure, when the read operation of the memory fails, a set of read retry tables is obtained, wherein the set of read retry tables comprises all read retry tables corresponding to multiple types of pages of the memory, and a read retry table corresponding to each type of page comprises a set of bias voltages corresponding to respective read voltage levels that are used to distinguish stored data of corresponding bit; then, a target read retry table is obtained from the set of read retry tables, and read retry voltages are obtained through the target read retry table; finally, a read retry operation is performed using the read retry voltages. In other words, in the examples of the present disclosure, in the process of obtaining the target read retry table from the set of read retry tables, the set of read retry tables is arranged as multiple subsets of read retry tables corresponding to the multiple types of pages, according to the multiple types of pages corresponding to the memory cell. Each subset of read retry tables comprises a plurality of read retry tables corresponding to this type of page, and each read retry table comprises bias voltages corresponding to a portion of read voltage levels (levels corresponding to each type of page). In this way, when the threshold voltage shift appears due to different problems, only the subset of read retry tables corresponding to the type of page is polled, that is, the process of polling non-target read retry tables during the read retry operation is reduced, so that the polling of the set of read retry tables during the read retry operation is more targeted, thus improving the efficiency of the read retry operation, improving the fitness of the read retry table and improving the read performance of the memory system.

The methods disclosed in several method examples provided in the present disclosure can be arbitrarily combined to obtain a new method example without conflict.

The foregoing is only specific implementations of the present disclosure, but the scope of protection of the present disclosure is not limited thereto. Any variation or replacement readily contemplated by those skilled in the art within the scope of the present disclosure should be covered within the scope of protection of the present disclosure. Therefore, the scope of protection of this disclosure shall be subject to the scope of protection of the claims.

What is claimed is:

1. A memory system comprising:
a memory, wherein the memory includes:
a plurality of word lines;
a plurality of multi-bit memory cells coupled to the plurality of word lines; and
multiple types of pages, wherein type of page corresponds to at least one read voltage level; and
a memory controller coupled to the memory and configured to:
obtain, when a read operation of the memory fails, a target read retry table from a set of read retry tables wherein, each type of page in the multiple types of pages corresponds to a plurality of read retry tables, and wherein the set of read retry tables includes all read retry tables corresponding to the multiple types of pages, and wherein a read retry table corresponding to each type of page includes a set of bias voltages corresponding to respective read voltage levels that are used to distinguish stored data of corresponding bit; and
obtain read retry voltages through the target read retry table, and perform a read retry operation using the read retry voltages.

2. The memory system according to claim 1, wherein the memory cells include an M-bit memory cell, the memory includes M types of pages, and data of the M-bit memory cell is read through N read voltage levels; M and N are each integers greater than 1, and $N=2^M-1$;
the respective read voltage levels that are used to distinguish the stored data of the corresponding bit for a read retry table corresponding to each type of page are determined according to encoding rules.

3. The memory system according to claim 2, wherein the memory cells include a three-bit memory cell, the memory includes an upper page, a middle page, and a lower page, and data of the three-bit memory cell is read through seven read voltage levels;
the set of read retry tables includes a plurality of read retry tables corresponding to the upper page, the middle page, and the lower page, respectively; a read retry table corresponding to the lower page comprises a set of bias voltages corresponding to a first read voltage level and a fifth read voltage level; a read retry table corresponding to the middle page includes a set of bias voltages corresponding to a second read voltage level, a fourth read voltage level, and sixth read voltage level; a read retry table corresponding to the upper page includes a set of bias voltages corresponding to a third read voltage level and a seventh read voltage level.

4. The memory system according to claim 3, wherein the memory further includes a storage element;
the plurality of read retry tables corresponding to the upper page are stored in a first area of the storage element; the plurality of read retry tables corresponding to the middle page are stored in a second area of the storage element; the plurality of read retry tables corresponding to the lower page are stored in a third area of the storage element;
wherein the first area, the second area and the third area are different management areas in the storage element.

5. The memory system according to claim 1, wherein the plurality of read retry tables corresponding to each type of page include multiple sets of bias voltages corresponding to different test items;
the memory controller is configured to:
in obtaining the target read retry table from the set of read retry tables, determine, according to a test item underwent by the memory, at least one type of page affected by the test item; and
obtain the target read retry table from the read retry tables corresponding to the affected at least one type of page.

6. The memory system according to claim 5, wherein the test item include at least one of the following:
read disturbance;
data retention;
operation life; or
temperature.

7. The memory system according to claim 1, wherein the memory controller is configured to:
in obtaining the target read retry table from the set of read retry tables, obtain, as the target read retry table, a read retry table from the plurality of read retry tables corresponding to each type of page using a least recently used LRU algorithm.

8. The memory system according to claim 1, wherein the memory controller is configured to:
   obtain bias voltages corresponding to the respective read voltage levels according to the target read retry table;
   obtain the read retry voltages by adding the read voltages of failed read operations and the bias voltages.

9. The memory system according to claim 1, wherein the memory controller is further configured to:
   perform a soft bit decoding operation when the read retry operation fails;
   perform a redundant array re-encoding operation when the soft bit decoding operation fails.

10. The memory system according to claim 1, wherein the memory system includes a universal flash memory (UFS) device or a solid state disk.

11. An operation method of a memory system, wherein the memory system comprises: at least one memory and a memory controller coupled to the memory; the memory comprises a plurality of word lines and a plurality of multi-bit memory cells coupled to the plurality of word lines; the memory comprises multiple types of pages; each type of page corresponds to at least one read voltage level;
   the operation method comprises:
   obtaining, when a read operation of the memory fails, a target read retry table from a set of read retry tables, wherein, each type of page in the multiple types of pages corresponds to a plurality of read retry tables, and wherein the set of read retry tables comprises all read retry tables corresponding to the multiple types of pages, and wherein a read retry table corresponding to each type of page comprises a set of bias voltages corresponding to respective read voltage levels that are used to distinguish stored data of corresponding bit;
   obtaining read retry voltages through the target read retry table, and performing a read retry operation using the read retry voltages.

12. The operation method of the memory system according to claim 11, wherein the memory cells include an M-bit memory cell, the memory includes M types of pages, and data of the M-bit memory cell is read through N read voltage levels; M and N are each integers greater than 1, and $N=2^M-1$;
   the respective read voltage levels that are used to distinguish the stored data of the corresponding bit for a read retry table corresponding to each type of page are determined according to encoding rules.

13. The operation method of the memory system according to claim 12, wherein the memory cells include a three-bit memory cell, the memory comprises an upper page, a middle page, and a lower page, and data of the three-bit memory cell is read through seven read voltage levels;
   the set of read retry tables includes a plurality of read retry tables corresponding to the upper page, the middle page, and the lower page, respectively; a read retry table corresponding to the lower page comprises a set of bias voltages corresponding to a first read voltage level and a fifth read voltage level; a read retry table corresponding to the middle page includes a set of bias voltages corresponding to a second read voltage level, a fourth read voltage level, and a sixth read voltage level; a read retry table corresponding to the upper page includes a set of bias voltages corresponding to a third read voltage level and a seventh read voltage levels.

14. The operation method of the memory system according to claim 13, further comprising:
   managing the read retry tables corresponding to different types of pages respectively, using different areas of a storage element in the memory.

15. The operation method of the memory system according to claim 11, wherein obtaining the target read retry table from the set of read retry tables comprises:
   determining, according to a test item underwent by the memory, at least one type of page affected by the test item; and
   obtaining the target read retry table from the read retry tables corresponding to the affected at least one type of page.

16. The operation method of the memory system according to claim 11, further comprising:
   in obtaining the target read retry table from the set of read retry tables, obtaining, as the target read retry table, a read retry table from the plurality of read retry tables corresponding to each type of page using a least recently used LRU algorithm.

17. The operation method of the memory system according to claim 11, wherein the plurality of read retry tables corresponding to each type of page comprise multiple sets of bias voltages corresponding to different test items;
   the method further comprises:
   obtaining bias voltages corresponding to the respective read voltage levels according to the target read retry table;
   obtaining the read retry voltages by adding the read voltages of failed operations and the bias voltages.

18. The operation method of the memory system according to claim 11, further comprising:
   performing a soft bit decoding operation when the read retry operation fails;
   performing a redundant array re-encoding operation when the soft bit decoding operation fails.

19. An electronic device comprising:
   a memory system including:
      a memory, wherein the memory includes:
         a plurality of word lines;
         a plurality of multi-bit memory cells coupled to the plurality of word lines; and
         multiple types of pages, wherein type of page corresponds to at least one read voltage level; and
      a memory controller coupled to the memory and configured to:
         obtain, when a read operation of the memory fails, a target read retry table from a set of read retry tables wherein, each type of page in the multiple types of pages corresponds to a plurality of read retry tables, and wherein the set of read retry tables includes all read retry tables corresponding to the multiple types of pages, and wherein a read retry table corresponding to each type of page includes a set of bias voltages corresponding to respective read voltage levels that are used to distinguish stored data of corresponding bit; and
         obtain read retry voltages through the target read retry table, and perform a read retry operation using the read retry voltages.

20. The electronic device according to claim 19, wherein the memory cells include an M-bit memory cell, the memory includes M types of pages, and data of the M-bit memory cell is read through N read voltage levels; M and N are each integers greater than 1, and $N=2^M-1$;

the respective read voltage levels that are used to distinguish the stored data of the corresponding bit for a read retry table corresponding to each type of page are determined according to encoding rules.

* * * * *